United States Patent
Tailliet et al.

(10) Patent No.: US 9,245,627 B2
(45) Date of Patent: Jan. 26, 2016

(54) COMPACT MEMORY DEVICE INCLUDING A SRAM MEMORY PLANE AND A NON VOLATILE MEMORY PLANE, AND OPERATING METHODS

(71) Applicant: STMicroelectronics (Rousset) SAS, Rousset (FR)

(72) Inventors: François Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/296,014

(22) Filed: Jun. 4, 2014

(65) Prior Publication Data
US 2014/0369119 A1    Dec. 18, 2014

(30) Foreign Application Priority Data

Jun. 12, 2013  (FR) ..................................... 13 55440

(51) Int. Cl.
*G11C 14/00*   (2006.01)
*G11C 16/04*   (2006.01)
*G11C 5/02*   (2006.01)
*G11C 16/20*   (2006.01)
*G11C 11/404*   (2006.01)

(52) U.S. Cl.
CPC ........ *G11C 16/0408* (2013.01); *G11C 14/0063* (2013.01); *G11C 16/20* (2013.01); *G11C 11/404* (2013.01); *G11C 14/0018* (2013.01)

(58) Field of Classification Search
CPC ........... G11C 14/0018; G11C 14/0063; G11C 11/404
USPC .............................. 365/185.08, 154, 155, 156
See application file for complete search history.

(56) References Cited

U.S. PATENT DOCUMENTS

| | | | |
|---|---|---|---|
| 4,132,905 | A | 1/1979 | Stein |
| 4,467,451 | A | 8/1984 | Moyer |
| 4,980,859 | A | 12/1990 | Guterman et al. |
| 5,357,468 | A | 10/1994 | Satani et al. |
| 5,519,663 | A | 5/1996 | Harper, Jr. et al. |
| 6,006,313 | A * | 12/1999 | Fukumoto ..................... 711/211 |

(Continued)

FOREIGN PATENT DOCUMENTS

| | | |
|---|---|---|
| EP | 0250060 A1 | 12/1987 |
| EP | 1575075 A2 | 9/2005 |

OTHER PUBLICATIONS

French Search Report received in Application No. 1355440 mailed Apr. 16, 2014, 10 pages.

*Primary Examiner* — Ly D Pham
(74) *Attorney, Agent, or Firm* — Slater & Matsil, L.L.P.

(57) ABSTRACT

A memory device includes a memory cell with an elementary SRAM-type cell and an elementary module coupled between a supply terminal and the elementary SRAM-type cell. The elementary module has a single nonvolatile EEPROM elementary memory cell that includes a floating gate transistor. The elementary module also has a controllable interconnection stage that can be controlled by a control signal external to the memory cell. The nonvolatile elementary memory cell and the controllable interconnection stage are connected to one another. The floating gate transistor of the nonvolatile memory cell is controllable to be turned off when a data item stored in the elementary SRAM-type cell is programmed into the nonvolatile elementary cell.

30 Claims, 16 Drawing Sheets

(56) References Cited

U.S. PATENT DOCUMENTS

| | | |
|---|---|---|
| 6,469,930 B1 | 10/2002 | Murray |
| 7,092,293 B1 | 8/2006 | Young et al. |
| 7,164,608 B2 | 1/2007 | Lee |
| 8,018,768 B2 | 9/2011 | Shih et al. |
| 8,331,150 B2 | 12/2012 | Hsu et al. |
| 2009/0190402 A1 | 7/2009 | Hsu et al. |

* cited by examiner

FIG.14
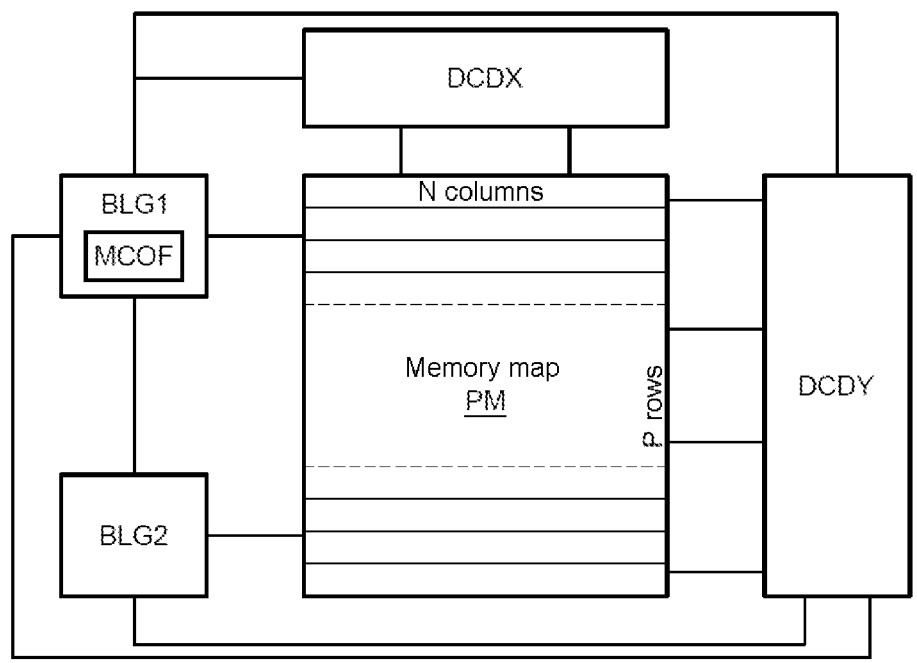
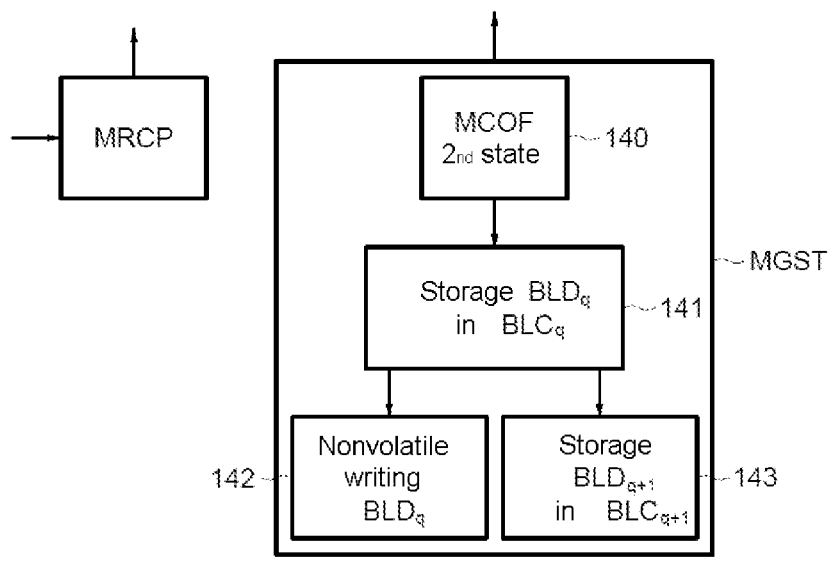

COMPACT MEMORY DEVICE INCLUDING A SRAM MEMORY PLANE AND A NON VOLATILE MEMORY PLANE, AND OPERATING METHODS

This application claims the benefit of French Application No. 1355440, filed on Jun. 12, 2013, which application is hereby incorporated herein by reference.

TECHNICAL FIELD

The invention relates to memory devices and, in particular embodiments, to memory associating, within one and the same memory cell, an elementary cell of static random access memory type (SRAM) and a nonvolatile elementary memory cell.

BACKGROUND

An elementary SRAM-type cell is a volatile memory cell, that is to say, a memory cell that loses its data in the event of a power cut, but that offers a very rapid access speed and infinite cycling.

A nonvolatile elementary memory cell, for example a memory cell of EEPROM type, allows the data item to be preserved in the event of a power cut but cannot be cycled indefinitely.

A memory cell associating an elementary cell of SRAM type and one or more nonvolatile cells allows accumulation of the levels of performance of the two approaches, namely the speed and the infinite endurance of the SRAM memory and the nonvolatility of the nonvolatile memory.

Under normal operating condition, a data item is written and read to/from a memory cell of this kind in the elementary cell of SRAM type. On the other hand, notably when there is a power cut, the content of the SRAM elementary cell is transferred to the nonvolatile elementary memory cell(s) associated therewith.

Then, notably when power returns, the data contained in the nonvolatile memory cell(s) are reloaded into the corresponding SRAM elementary memory cell.

Architectures of such memory cells associating SRAM memory and nonvolatile memory are described in U.S. Pat. Nos. 4,132,905, 4,467,451, 4,980,859, 7,164,608 and 8,018,768.

Among these documents, the first four describe structures of memory cells associating an elementary SRAM-type cell and several nonvolatile cells, with the notable drawback of complexity of structure and/or the need to have an SRAM cell that supports high voltage and/or large constraints for the reloading phase of the SRAM cell.

U.S. Pat. No. 8,018,768 describes a memory cell having an elementary SRAM-type cell and a single nonvolatile elementary memory cell of Flash type. The cell structure described in this document is complex notably on account of the presence of an additional inverter connected between the Flash elementary cell and the SRAM cell. This additional inverter, controlled by the nonvolatile elementary memory cell, is used when the data item is reloaded into the SRAM memory, in order to pull the output of an inverter of the SRAM cell to ground, while the input of this additional inverter is pulled to the supply voltage by means of the Flash cell.

SUMMARY

One embodiment proposes a new memory device associating a static memory and a nonvolatile memory, having a reduced bulk and affording improved performance levels. The nonvolatile memory is typically an electrically erasable and programmable read only memory type (EEPROM), although it is possible to use a nonvolatile elementary memory cell of Flash type One aspect proposes a memory device comprising at least one memory cell having an elementary SRAM-type cell and an elementary module connected between a supply terminal and the elementary SRAM-type cell. The elementary module has a single nonvolatile elementary memory cell and an interconnection stage that can be controlled by at least one control signal external to the memory cell. The nonvolatile elementary memory cell and the controllable interconnection stage are connected to one another.

Independently of the presence of this interconnection stage, and whatever the type of nonvolatile memory (EEPROM or FLASH), the floating-gate transistor can advantageously be controlled so that it is turned off when a data item stored in the SRAM elementary memory cell is programmed into the nonvolatile elementary memory cell.

The fact that the floating-gate transistor is off during the programming makes it possible, in some configurations, particularly when the supply terminal is grounded, to avoid shorting the SRAM elementary memory cell without using an isolation transistor. This helps to gain structural compactness.

Furthermore, when the nonvolatile elementary memory cell is of EEPROM type, such behaviour is distinguished from the programming in a conventional EEPROM memory cell, in which the floating-gate transistor is on during the programming.

Another aspect proposes a memory device, comprising at least one memory cell having an elementary SRAM-type cell and a single nonvolatile elementary memory cell of EEPROM type connected between a supply terminal and the elementary SRAM-type cell.

Even when the nonvolatile elementary memory cell is of EEPROM type, the memory cell advantageously comprises an elementary module connected between the supply terminal and the elementary SRAM-type cell, this elementary module having the nonvolatile elementary memory cell of EEPROM type and an interconnection stage that can be controlled by at least one control signal external to the memory cell, the nonvolatile elementary memory cell of EEPROM type and the controllable interconnection stage being connected to one another.

The supply terminal is advantageously intended to be connected to ground. This notably allows more effective reloading of the SRAM cell by the nonvolatile cell.

Indeed, in this case, the reloading is effected by pulling an output node of an SRAM cell inverter to ground by means of the floating-gate transistor that is on. This is more effective than pulling a node to the supply voltage via an NMOS transistor.

Whatever the type of nonvolatile memory, the interconnection stage can be connected between the nonvolatile elementary memory cell and the elementary SRAM-type cell or even between the nonvolatile elementary memory cell and the supply terminal.

Throughout the text, it is conventionally considered that a write cycle in the nonvolatile memory, for example an EEPROM memory or a Flash memory, comprises an erase cycle and a programming cycle.

Furthermore, when the interconnection stage is connected between the nonvolatile elementary memory cell and the elementary SRAM-type cell, the write cycle in the nonvolatile memory comprises an unconditional erase cycle followed by a selective programming cycle according to the value of the data item contained in the elementary SRAM-type cell.

On the other hand, when the interconnection stage is connected between the nonvolatile elementary memory cell and the supply terminal, the erase and programming cycles are both selective (or conditional) and it is noted in passing that the order thereof is immaterial in this configuration. In other words, the erase cycle may be followed or preceded by the programming cycle.

According to one embodiment, the elementary SRAM-type cell has two inverters connected to one another crosswise and the nonvolatile elementary memory cell comprises a floating-gate transistor having a first conduction electrode, for example the source, connected to the supply terminal, a control electrode connected to a first control line, and a second conduction electrode, for example the drain, connected to the output of a first inverter.

Two variants are possible as far as the structure of the interconnection stage is concerned.

According to a first variant, the interconnection stage comprises a first interconnection transistor connected in series with the floating-gate transistor and having a control electrode connected to a second control line, the set comprising the first interconnection transistor and the floating-gate transistor being connected between the supply terminal and the output of the first inverter.

Thus, in this variant, the first interconnection transistor is advantageously the only interconnection transistor (it may be arranged between the nonvolatile elementary memory cell and the SRAM elementary memory cell, or even between the nonvolatile elementary memory cell and the supply terminal) and the reloading of a data item contained in the nonvolatile elementary memory cell into the SRAM elementary memory cell is then effected by the same transistor as that used for transferring a data item contained in the SRAM elementary memory cell to the nonvolatile memory cell. However, this then results in a given inversion when the SRAM cell is read following the reloading.

According to another variant, the interconnection stage may comprise, apart from the first interconnection transistor, a second interconnection transistor having a control electrode connected to a third control line, connected in series between the floating-gate transistor and the output of the second inverter of the SRAM elementary memory cell.

Thus, according to this other variant, the SRAM elementary memory cell is reloaded by means of the second interconnection transistor, while the transfer from the SRAM elementary memory cell to the nonvolatile elementary memory cell is effected by means of the first interconnection transistor. Furthermore, these two interconnection transistors are connected to the two opposite branches of the two inverters of the SRAM cell. There is therefore no data inversion when the SRAM cell is reloaded by the nonvolatile cell.

Thus, when the interconnection stage has the first interconnection transistor which is placed between the nonvolatile elementary memory cell and the elementary SRAM-type cell, the writing of a data item stored in the elementary SRAM-type cell to the nonvolatile elementary memory cell comprises, according to one implementation, an erase cycle for the nonvolatile elementary memory cell followed by a programming cycle involving putting the first interconnection transistor into an on state and applying a negative programming voltage to the control electrode of the floating-gate transistor, so as to turn off the floating-gate transistor during programming, the supply terminal advantageously being grounded.

When the interconnection stage has the two interconnection transistors that are situated between the floating-gate transistor and the elementary SRAM-type cell, the writing of a data item stored in the elementary SRAM-type cell to the nonvolatile elementary memory cell comprises, according to one implementation, an erase cycle for the nonvolatile elementary memory cell followed by a programming cycle involving putting the first interconnection transistor into an on state, putting the second interconnection transistor into an off state and applying a negative programming voltage to the control electrode of the floating-gate transistor, so as to turn off the floating-gate transistor during programming, the supply terminal advantageously being grounded.

Although not essential, it is particularly advantageous that, during the programming, the programming voltage is negative.

Indeed, this allows the use of a low-voltage elementary SRAM-type cell because, in this case, the highest voltage is the supply voltage of the elementary cell of SRAM type, typically in the order of a few volts.

The nonuse of a negative programming voltage would have necessitated the use of a nonvolatile elementary memory cell, for example of EEPROM type, having a threshold voltage of a few volts, in combination with an elementary SRAM-type cell that is capable of supporting a high voltage, typically in the order of fifteen or so volts.

When the interconnection stage comprises the first interconnection transistor arranged between the volatile elementary memory cell and the supply terminal that is advantageously grounded, the writing of a data item stored in the elementary SRAM-type cell to the nonvolatile elementary memory cell comprises, according to one implementation, an erase cycle for the nonvolatile elementary memory cell followed or preceded by a programming cycle involving putting the first interconnection transistor into an off state and applying a negative programming voltage to the control electrode of the floating-gate transistor. This incidentally likewise turns off the floating-gate transistor during the programming.

Another implementation likewise proposes an erase cycle for the nonvolatile elementary memory cell comprising, when the interconnection stage has a single interconnection transistor, arranged between the supply terminal and the floating-gate transistor, putting the interconnection transistor into an off state and applying to the control electrode of the floating-gate transistor an erase voltage turning off the floating-gate transistor or leaving it in the state preceding the erasure at the conclusion of the erasure, as a function of the binary value of the data item.

In other words, the erasure is conditional in this configuration.

A method of reloading a data item written to the nonvolatile elementary memory cell into the elementary SRAM-type cell is also proposed.

When the supply terminal is grounded and the interconnection stage has a single interconnection transistor, arranged between the supply terminal and the floating-gate transistor or between the floating-gate transistor and the SRAM elementary cell, the reloading comprises initialization of the SRAM cell by writing a data item to the SRAM cell in the logic state such that the node common to the first interconnection transistor and to the output of the corresponding inverter of the elementary SRAM-type cell is in the high state, putting the first interconnection transistor into an on state and applying a read voltage to the control electrode of the floating-gate transistor.

When the supply terminal is grounded and the interconnection stage comprises two interconnection transistors arranged between the nonvolatile elementary memory cell and the SRAM elementary memory cell, the reloading method may likewise comprise initialization of the SRAM cell by writing a logic data item to the SRAM cell such that the node common to the second interconnection transistor and to the output of the corresponding inverter is in the high state, putting the first interconnection transistor into an off state and the second interconnection transistor into an on state, and applying a read voltage to the control electrode of the floating-gate transistor.

According to one embodiment, in which the device comprises a memory map containing several memory cells organized into rows and columns and bit lines and complementary bit lines common to the memory cells of at least some pairs of adjacent columns of cells, two different word lines are associated with each row of cells and the two access transistors of the elementary cell of SRAM type of a memory cell are respectively connected to the corresponding common bit lines and complementary bit lines, and the control electrodes of the two pairs of access transistors of two adjacent cells of SRAM type are respectively connected to the two different word lines.

Such an embodiment allows a gain in space for the placement diagram ("layout") and amounts to interleaving two logical word lines over a single physical row.

According to another embodiment, in which the device comprises a memory map containing several memory cells organized into blocks of cells, there is likewise provision for controllable circuitry possessing a first state in which the circuitry is capable of putting all memory cells of the memory map either into a read or write mode of SRAM type, or into a write mode for the nonvolatile elementary memory cells, and a second state in which the circuitry is capable of selectively putting, block by block, all memory cells of a block either into a read or write mode of SRAM type or into a write mode for the nonvolatile elementary memory cells.

Such an embodiment makes it a simple matter to implement the memory device in a chip capable of operating in wired mode or in contactless mode, for example in technology of NFC (Near Field Communication) type.

Indeed, in a wired mode, that is to say when the memory device receives data via a bus typically having a high speed, for example a bus 12C with a speed of 1 Mb/second or a bus of SPI type with a speed of greater than 1 Mb/second, it is particularly advantageous for the nonvolatile write speed to be the highest possible, or even higher than the speed of the bus. Moreover, during a power cut, it is advantageous to be able to write a maximum of data to the nonvolatile elementary memory cells, for example the whole SRAM memory map, in a single pass. The high power available in wired mode affords this possibility.

On the other hand, in contactless mode, the available power is low, hence the need to reduce consumption for nonvolatile writing to the memory device. Furthermore, in contactless mode, the bus has a low speed, for example a speed of 106 kb/second when communication takes place in accordance with the ISO 14 443 type B protocol. It is therefore particularly advantageous to be able to write by successive blocks. Indeed, the maximum nonvolatile write speed of the memory device is thus divided by the number of blocks and the consumption during nonvolatile writing is greatly reduced because, in the first order, it is practically divided by the number of blocks.

Thus, according to another embodiment, the device furthermore comprises reception means configured to receive successive blocks of data and management means configured to put the configuration means into their second state, store a current block of data in the elementary memory cells of SRAM type of the memory cells of a block of memory cells, then carry out a nonvolatile write cycle for the data thus written to the SRAM cells, in the nonvolatile elementary memory cells of the memory cells of the block of cells and, at the same time as the nonvolatile writing, store the support block of data in the elementary memory cells of SRAM type of the memory cells of another block of memory cells.

In other words, it becomes possible to load SRAM data into a portion of the memory map while another sector of the memory map is undergoing nonvolatile writing.

Furthermore, when the memory map contains several memory cells organized into rows and columns, each block of memory cells has several rows of memory cells, for example.

Generally, during a power cut, the whole content of the SRAM memory is transferred to the nonvolatile memory in a single write cycle. Furthermore, upon power-up, the content of the nonvolatile elementary cells is reloaded into the SRAM elementary memory cells.

Furthermore, in this respect, the whole memory map is generally supplied upon power-up, which necessitates putting all cells into a known reinitialized state and, at the same time or subsequently, reloading the nonvolatile data into the associated SRAM elementary cells.

These two steps are both consumers of current, which presents a problem in the case of a chip incorporating such a memory device and having to operate under low consumption, for example self-powered radio-frequency or NFC chips. Indeed, in the latter case, since the energy budget is limited, the current surge necessary for executing these two steps thus risks causing a fall in supply voltage and stoppage of the chip then restarting the chip followed again by stoppage, and so on.

Consequently, according to one embodiment, provision is made for control means configured so as, during power-up of the device, for example following a power supply drop, not to supply power to the memory map and to authorize the supply of power to a set of at least one memory cell and the reloading of the elementary SRAM-type cell of the at least one memory cell with the content of the associated nonvolatile elementary memory cell, only when the elementary SRAM-type cell is addressed.

Thus, according to this embodiment, the memory map is not supplied with power upon power-up and will be supplied with power progressively by subportions according to need. Although it is possible to supply power to the memory map on a cell-by-cell basis, it is generally easier to provide a set having several memory cells and to authorize the supply of power to the set and the reloading of all elementary memory cells of SRAM type in this set with a content of the corresponding nonvolatile elementary memory cells only when at least one elementary cell of SRAM type in the set is addressed.

In general, the memory map contains several memory cells organized into rows and columns, and the set of memory cells may have at least one row of memory cells, and generally several rows, for example two.

BRIEF DESCRIPTION OF THE DRAWINGS

Other advantages and characteristics of the invention will become apparent on examining the detailed description of wholly non-limiting modes of implementation and embodiment, and the appended drawings in which:

FIGS. 1 to 18 schematically illustrate various implementations and embodiments of a device according to the invention.

DETAILED DESCRIPTION OF ILLUSTRATIVE EMBODIMENTS

Figure 1:
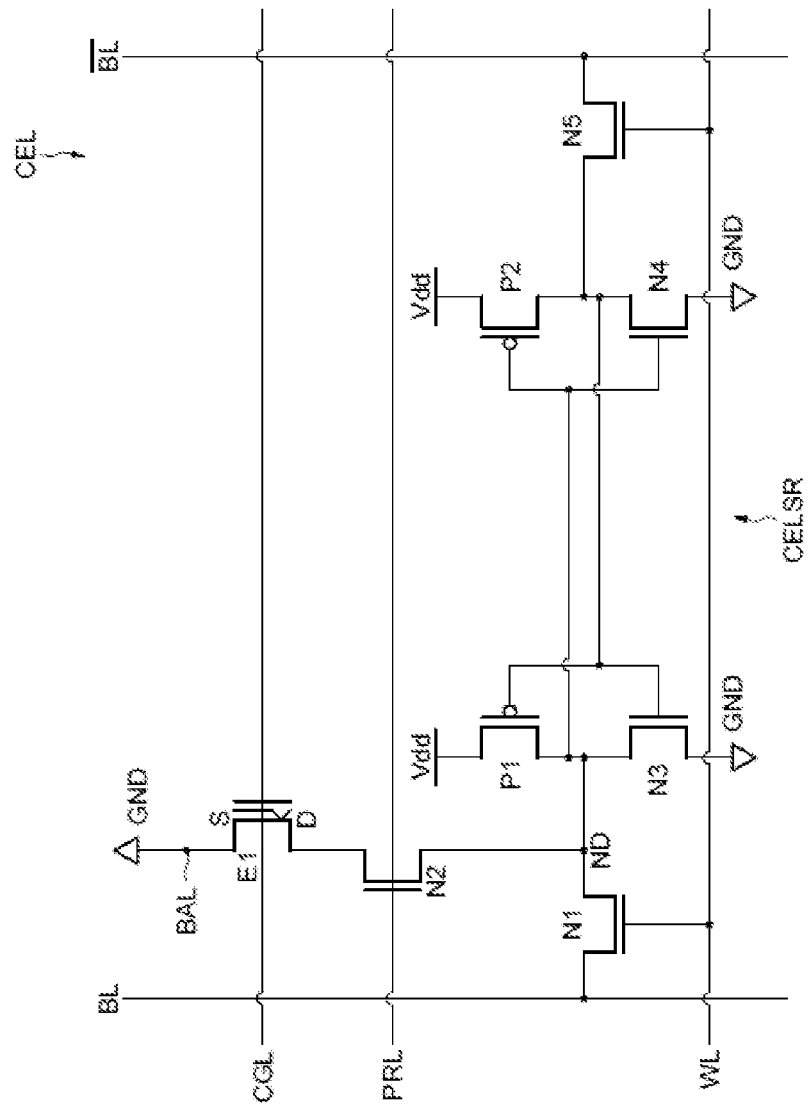

In FIG. 1, the reference CEL denotes a memory cell having an elementary SRAM-type cell CELSR and a single nonvolatile elementary cell of EEPROM type, in this case having a floating-gate transistor E1.

The EEPROM nonvolatile cell of the cell CEL is a conventional cell. That is to say, a memory cell in which the selection transistor has been removed and having a tunnel injection region between floating gate and drain.

The source of the transistor E1 is connected to a supply terminal BAL that is grounded in this case.

The control electrode of the floating-gate transistor E1 is itself connected to a first control line CGL.

The elementary cell CELSR is of conventional structure and comprises a first inverter having the PMOS transistor P1 and the NMOS transistor N3, and a second inverter having the PMOS transistor P2 and the NMOS transistor N4. These two inverters are connected between another power supply terminal that is intended to be connected to the power supply voltage Vdd and ground.

These two inverters are connected to one another crosswise, that is to say that the input of the first inverter, formed by the gates of the transistors P1 and N3, is connected to the output of the second inverter, formed by the drains of the transistors N4 and P2, while the input of the second inverter, formed by the gates of the transistors P2 and N4, is connected to the output of the first inverter, formed by the drains of the transistors P1 and N3.

The cell CELSR likewise has two NMOS access transistors, referenced N1 and N5, respectively connected between the outputs of the two inverters and two bit lines BL and $\overline{BL}$, $\overline{BL}$ denoting the complementary bit line for the line BL.

The gates of the access transistors N1 and N5 are connected to a word line WL.

The drain of the floating-gate transistor E1 is in this case connected to the output (node ND) of the first inverter P1, N3 of the elementary memory cell CELSR by means of an interconnection stage, in this case having a first interconnection transistor N2. This single interconnection transistor N2 is in this case an NMOS transistor.

The control electrode (gate) of this first interconnection transistor N2 is connected to a second control line PRL. Therefore, the interconnection stage is controlled by a signal external to the memory cell CEL, namely by the control voltage present on the second control line PRL.

It will be noted in this case that the memory cell CEL has eight transistors, which makes it particularly compact.

Figure 2:
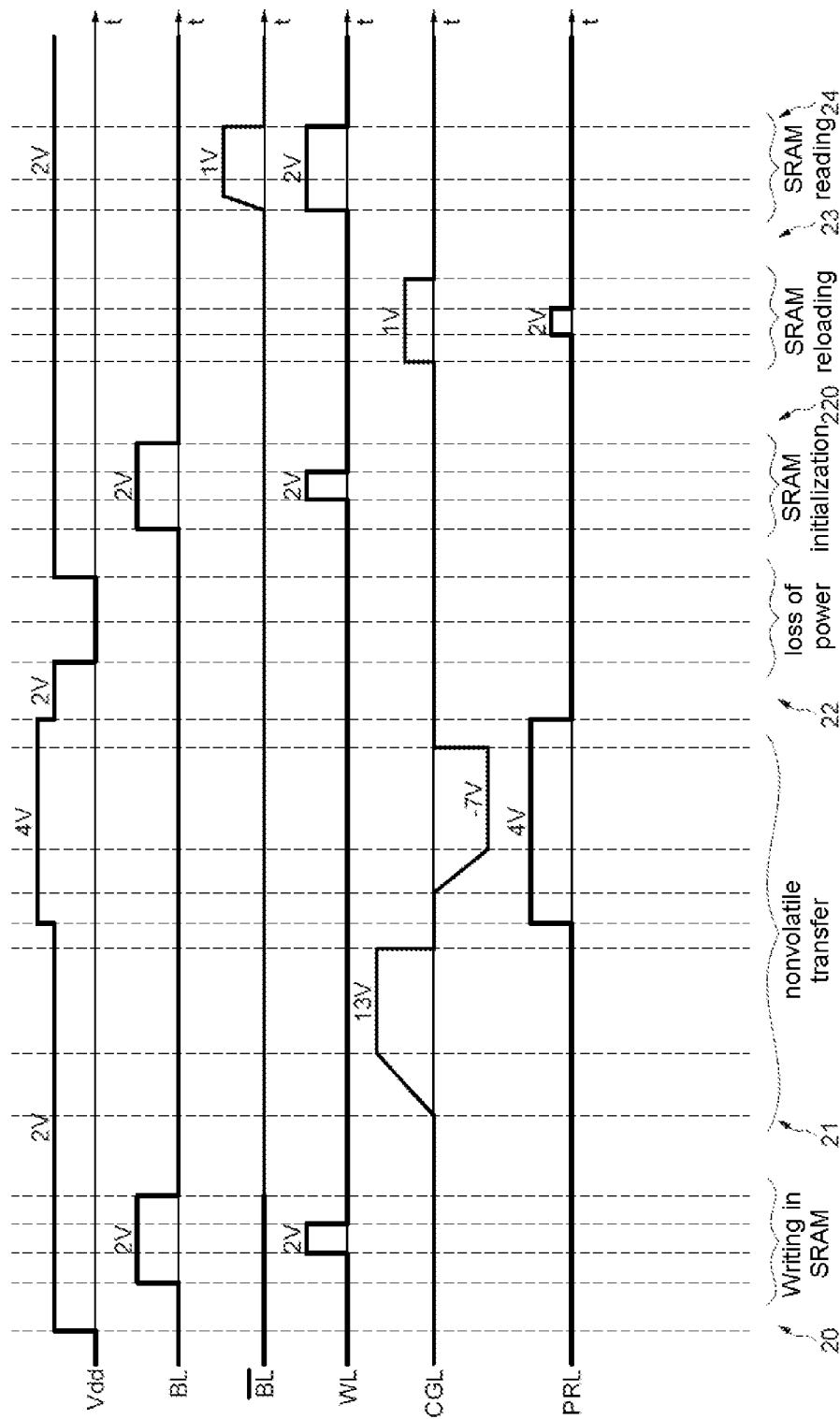

Reference will now be made more particularly to FIG. 2, which is a timing diagram illustrating various modes of operation of the memory cell CEL of FIG. 1.

The writing to the elementary memory cell CELSR, referenced 20 in FIG. 2, is conventional writing More precisely, to write a "1", the bit line BL is brought to the supply voltage Vdd (in this case two volts), while the complementary bit line $\overline{BL}$ is at ground and the word line WL is brought to the supply voltage Vdd.

The control line PRL is at ground, turning off the interconnection stage. Equally, the first control line CGL is likewise at ground.

The drain of the transistor N4 and the gates of the transistors P1 and N3 are pulled to ground by means of the transistor N5, which is on. The latch formed by the two crossed inverters is thus toggled by virtue of the drain of the transistor N3 changing to Vdd and the drain of the transistor N4 changing to ground.

When the cell is selected to write a "0" to the elementary cell CELSR, the bit line BL is at ground, the complementary bit line $\overline{BL}$ is at the supply voltage Vdd and the word line is likewise at the supply voltage Vdd.

The drain of the transistor N3 and the gate of the transistors P2 and N4 are pulled to ground by the transistor N1, which is on. The latch is toggled by means of the drain of the transistor N3, which changes to ground, and the drain of the transistor N4, which changes to Vdd.

The data item is held when the cell is deselected.

The reading of a data item from the cell CELSR is likewise conventional reading and is illustrated by the reference 24 in FIG. 2.

The read access to the cell is effected by the bit line BL and the complementary bit line $\overline{BL}$, the word line "WL" being brought to the supply voltage Vdd. One of the two bit lines is pulled to ground, the other being at the voltage Vdd minus the threshold voltage of an NMOS transistor. The different states of the bit lines are sent to conventional read circuitry so as to determine the logic value of the data item that has been read.

Nonvolatile transfer or storage 21 of the content of the cell CELSR to the nonvolatile elementary memory cell E1 will now be described.

Nonvolatile transfer or writing is made up of an erase cycle and a programming cycle.

For the erase cycle, the line PRL is held at ground, turning off the interconnection transistor N2. Next, an erase voltage is sent on the first control line CGL. In the example described here, this erase voltage has a ramp then a plateau having a typical amplitude of 13 volts. The rise in the ramp can typically be effected in approximately 0.5 millisecond, while the typical duration of the plateau is 1 millisecond.

By means of coupling to the first control line CGL, the floating gate of the transistor E1 rises to approximately 9 volts, turning on the nonvolatile cell and forcing the drain region to 0 volt.

The tunnel current discharges the floating gate of E1 to the drain region. Once the voltage on the first control line CGL has returned to rest (0 volt), there is a negative charge of approximately −1.5 volts on the floating gate of E1.

The cell E1 is then erased.

It is now supposed that the cell CELSR is positioned in order to store a "1", for example, that is to say that the source of the transistor N2 (node ND) is at the supply voltage Vdd while the output of the other inverter N4, P2 is at ground.

The word line WL is likewise at ground.

The programming cycle is then effected as follows.

The second control line PRL changes to the supply voltage Vdd, which in this case has changed to 4 volts.

Therefore, the interconnection transistor N2 is on.

A programming voltage is then sent on the first control line CGL.

This programming voltage is a negative voltage formed by a ramp then a plateau of typical amplitude −7 volts. There again, the duration of the ramp is typically 0.5 millisecond while the duration of the plateau is typically 1 millisecond.

The floating-gate transistor E1 is off.

The transistor N2, which is on, transfers a voltage equal to Vdd minus the threshold voltage of the NMOS transistor to the drain of the transistor E1.

The floating gate of the transistor E1, previously discharged to −1.5 volts, will fall to −6 volts through capacitive coupling. The potential difference through the injection region of the transistor E1 is typically 9.5 volts. Therefore, the floating gate of the transistor E1 will be charged positively by tunnel effect.

Once the voltage of the first control line CGL has returned to rest, that is to say at the conclusion of the programming, the positive charge of 1.5 volts on the floating gate of E1 turns on this cell and puts it into the written state.

It will be noted in this case that the fact that the floating-gate transistor E1 is turned off during the programming prevents the node ND from being shorted to ground (supply terminal BAL).

It is now supposed that the cell CELSR is positioned in order to store a "0", that is to say that the source of the transistor N2 is at ground while the output of the inverter P2, N4 is at the supply voltage Vdd. The word line WL is likewise at ground.

The programming cycle is then effected as follows.

The second control line PRL changes, there again, to the supply voltage Vdd, turning on the interconnection transistor N2. The programming voltage is then sent on the first control line CGL. This programming voltage is similar to that which was sent when the cell CELSR contained a "1".

The floating-gate transistor E1 is therefore off.

The transistor N2, which is on, transfers a zero voltage to the drain of the transistor E1.

The floating gate of the transistor E1, previously discharged to −1.5 volts, will, through capacitive coupling, fall to −6.5 volts. The potential difference to the injection region of the transistor E1 is this time in the order of 6.5 volts, which is insufficient to charge this gate by tunnel effect. The floating gate of the transistor E1 therefore remains discharged.

Once the voltage of the first control line CGL has returned to rest, that is to say at the conclusion of the programming, the charge of −1.5 volts on the floating gate of E1 turns off this cell and puts it into the erased state.

It is therefore noted here that the erasure of the nonvolatile cell is unconditional erasure, while the programming is selective according to the value of the data item contained in the SRAM cell CELSR, that is to say according to the drain voltage of the nonvolatile cell.

It is then supposed that a loss of power 22 occurs, followed by power-up again. Thus, the reloading 23 of the nonvolatile data item (that is to say the data item contained in the nonvolatile cell E1) into the SRAM cell CELSR will now be described.

Prior to this reloading, initialization 220 (or reinitialization) of the SRAM elementary memory cell CELSR is effected so as to initialize it to a known state and to prevent it from being in a metastable state.

In the example described here, this initialization 220 is effected by writing a "1" to the SRAM cell using the conventional writing procedure.

For the reloading, the first control line CGL changes to a reference read voltage, typically 1 volt, while the second control line PRL is at a voltage of 2 volts, for example so as to turn on the interconnection transistor N2.

The voltage of the word line WL is zero.

If the SRAM cell CELSR initially stored (prior to a power cut) a logic "1", and therefore the data item stored in the nonvolatile cell E1 (which needs to be reloaded) is likewise a logic "1", then the nonvolatile cell E1, which is on, pulls the common node ND to ground through the transistor N2, which is on. Therefore, the cell CELSR toggles to the logic state "0".

If the cell CELSR initially stored a logic "0", then the nonvolatile cell E2 is off and the cell CELSR remains in the initialized state, that is to say the logic "1" state.

It is thus observed that the reloaded data item of the SRAM cell is inverted in relation to the initial data item after a nonvolatile transfer to the nonvolatile cell followed by reloading from this nonvolatile cell.

It is worth noting that, in the embodiment of FIG. 1, the interconnection transistor N2 could have been connected not to the output of the inverter P1, N3 but to the output of the inverter P2, N4. This would not have changed anything about the write cycle (erasure then programming) of the nonvolatile cell. On the other hand, during the reloading from the nonvolatile cell to the SRAM cell, it would then have been necessary to initialize the SRAM cell by writing a logic "0" so as to have the high logic level at the common node of the transistors N2, P2 and P4.

Figure 3:
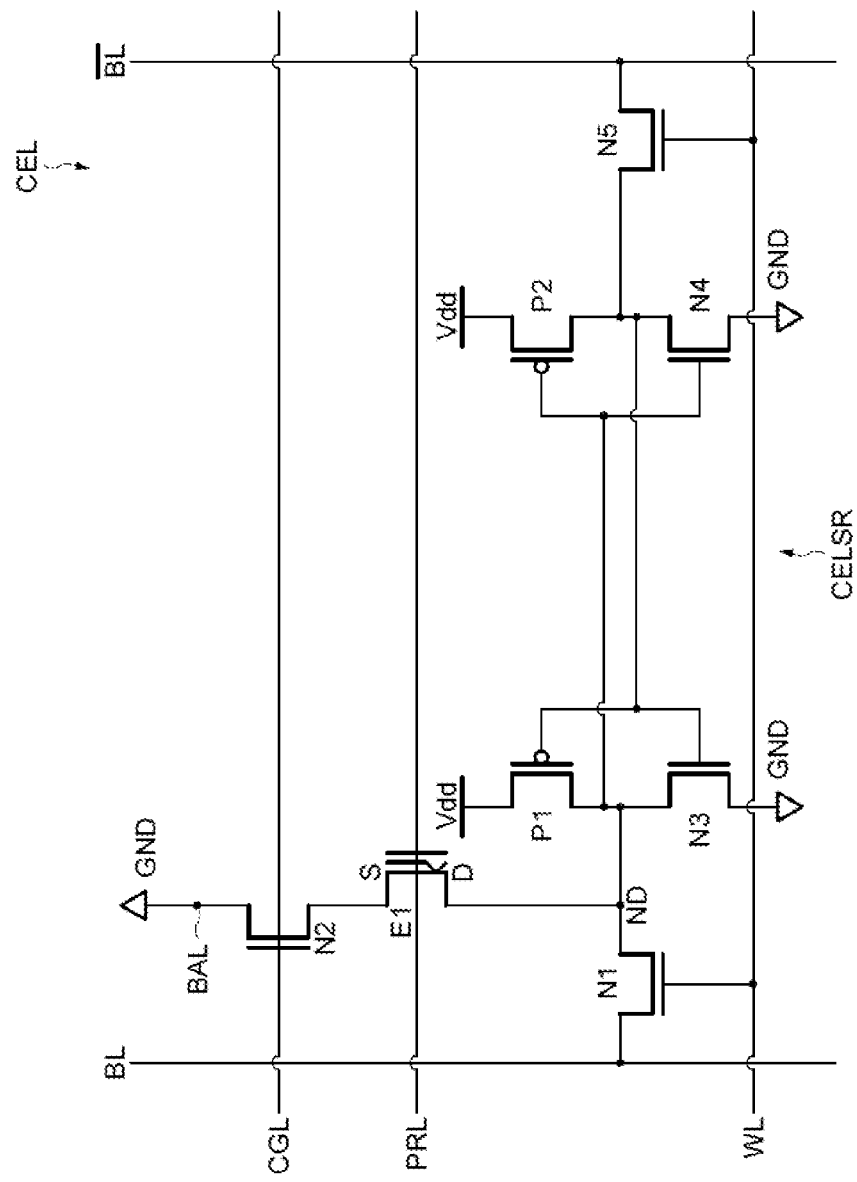

The embodiment of FIG. 3 differs from the embodiment of FIG. 1 in that the first interconnection transistor N2 is this time connected between the floating-gate transistor E1 and the supply terminal BAL, which is grounded GND.

As far as the operation of a cell CEL as shown in FIG. 3 is concerned, the reading from and writing to the SRAM memory cell CELSR are identical to steps 20 and 24 described above in reference to FIG. 2.

On the other hand, as will be seen now, the erase cycle, during the nonvolatile transfer of the data contained in the cell CLSR to the nonvolatile cell E1, is a conditional erase cycle.

More precisely, it is first of all supposed that the elementary SRAM-type cell CELSR contains a logic "1," that is to say that the node ND is in the high state.

The line PRL is held at ground, turning off the interconnection transistor N2.

The erase voltage is then sent on the first control line CGL. There again, in this example, this erase voltage has a ramp followed by a plateau having a typical amplitude of 13 volts. The rise of the ramp can, there again, be typically effected in approximately 0.5 ms, while the typical duration of the plateau is 1 ms.

By means of coupling to the first control line CGL and to the drain of the transistor E1 (which is connected to the node ND in the high state), the floating gate of the transistor E1 rises to approximately 10 volts. The potential difference through the injection region of E1, typically in the order of 7 volts, is then insufficient and the floating gate of E1 remains in its preceding state.

On the other hand, when the elementary SRAM-type cell CELSR contains a logic "0", the drain of the transistor E1 is at 0 volt.

The line PRL is still held at ground, turning off the interconnection transistor N2. The line WL is likewise held at ground.

The same erasure ramp is then sent on the first control line CGL (ramp then plateau of amplitude typically 13 volts).

By means of coupling to the line CGL, the floating gate of the transistor E1 rises to approximately 9 volts. However, the potential difference through the injection region of E1 is this time likewise in the order of 9 volts, which allows the floating gate of the transistor E1 to discharge.

Once the voltage on the first control line CGL has returned to rest (0 volt), there is a negative charge of approximately −1.5 volts on the floating gate of E1.

The cell E1 is then erased.

The programming cycle of the cell CEL in FIG. 3 is likewise a conditional programming cycle.

The only difference in relation to the conditional programming cycle of the cell in FIG. 1 lies in the fact that, in the case of FIG. 3, the second control line PRL is held at ground, turning off the interconnection transistor N2.

When the elementary memory cell CELSR contains a "1", the explanation that has been described in reference to FIG. 2 for the cell in FIG. 1 is identical for the cell in FIG. 3.

In other words, once the voltage of the first control line CGL has returned to rest (0 volt), the positive charge of 1.5 volts on the floating gate of E1 turns on this cell and puts it into the written state.

When the cell CELSR contains a "0", the conditional programming of the cell E1 in FIG. 3 is similar to the conditional programming of the cell E1 in FIG. 1 with the difference that, once the voltage of the first control line CGL has returned to rest (0 volt), the floating gate of E1 retains the charge acquired after the prior conditional erase cycle.

Thus, whereas the erasure is unconditional and the programming conditional in the embodiment of FIG. 1, the erasure and programming are both conditional in the embodiment of FIG. 3.

Therefore, the nonvolatile storage of a data item contained in the elementary memory cell CELSR, which data item is identical to the data item already contained in the nonvolatile elementary memory cell E1, will be effected without unconditional erasure and without conditional writing. Therefore, the embodiment of FIG. 3 preserves the endurance of unchanged bits (no wear on the nonvolatile elementary memory cell E1).

As far as the reloading of a data item contained in the nonvolatile elementary memory cell E1 into the elementary SRAM-type cell CELSR is concerned, it is identical to what has been described in reference to FIG. 1 with the same constraints of initialization of the SRAM cell as those mentioned in reference to FIG. 1.

Furthermore, there again, as indicated above, the drain of the floating-gate transistor E1 could be connected to the output of the inverter P2, N4 in return for, of course, as indicated above, initialization of the SRAM cell, prior to the reloading thereof, with a data item leading to a high state for the drain of the transistor E1.

It is likewise worth noting in the embodiment of FIG. 3 that when the SRAM elementary memory cell is being written to or read, the drain of the floating-gate transistor E1 may be at the supply voltage Vdd or at ground. Furthermore, when the drain is at Vdd for a long period, there may then be a risk of parasitic programming of the memory cell E1 ("disturb"). Consequently, it is preferable in some applications to bring the voltage of the first control line CGL to Vdd/2 when the SRAM is supplied with power, notably but not exclusively during the read and write phases of the SRAM elementary memory, so as to avoid this parasitic programming of E1. Of course, during the erase and programming cycles of the nonvolatile elementary memory cell, the first control line CGL receives the appropriate corresponding erase and programming voltages, for example those that have been described above.

Figure 4:
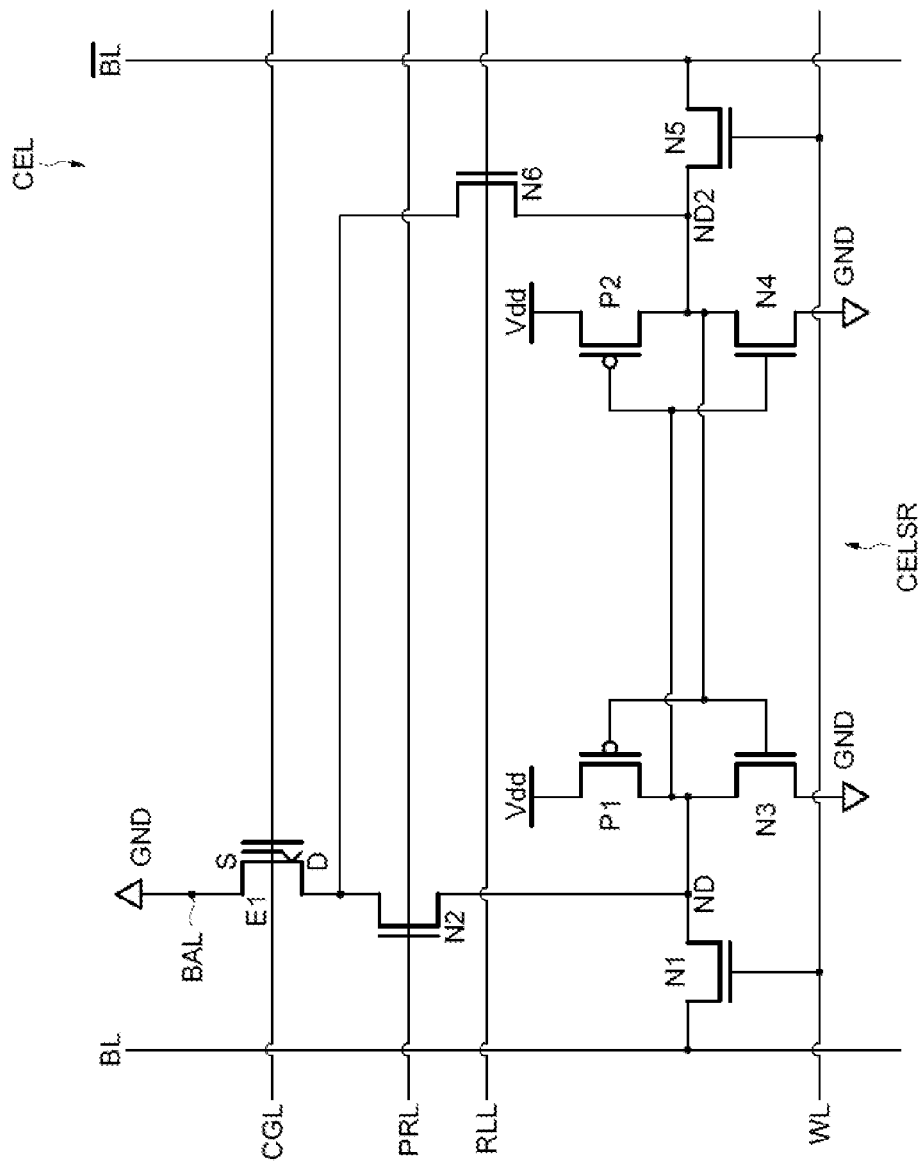

The embodiment of FIG. 4 differs from that of FIG. 1 in that the interconnection stage of the memory cell CEL comprises a second interconnection transistor N6.

This second interconnection transistor N6 has its control electrode (gate) connected to a third control line RLL. This second interconnection transistor N6 is connected in series with the floating-gate transistor E1 between the supply terminal BAL and the output of the second inverter P2, N4 of the elementary memory cell CELSR.

More precisely, the interconnection transistor N6 is connected between the drain of the transistor E1 and the output of the inverter P2, N4.

Figure 5:
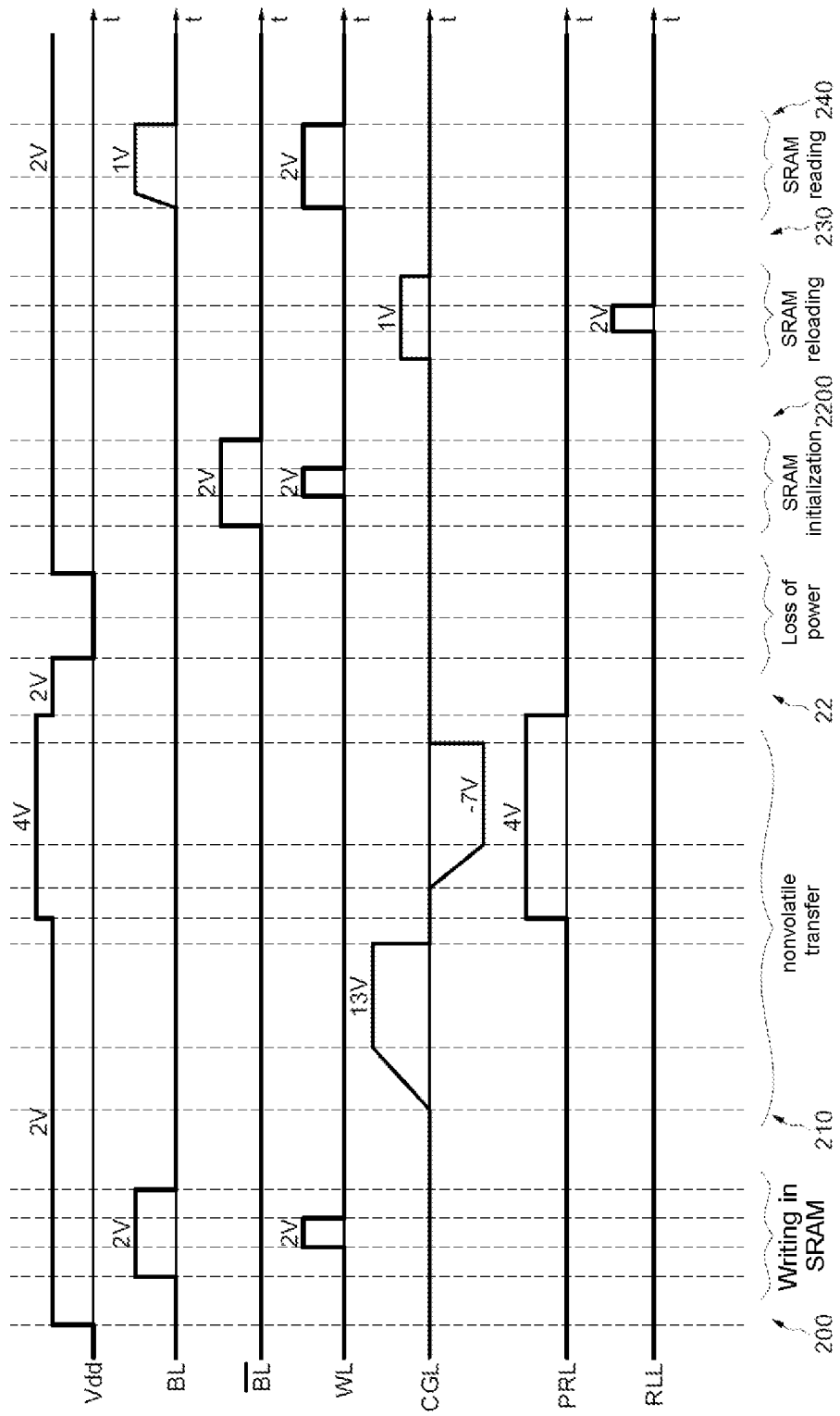

FIG. 5 is a timing diagram illustrating various modes of operation of the memory cell CEL in FIG. 4. It will be noted that the phases of writing (200) to the SRAM elementary cell, of nonvolatile transfer (210) and of reading (240) the SRAM elementary memory cell are identical to the equivalent phases 20, 21 and 24 that have been described in reference to FIG. 2 as far as the cell CEL in FIG. 1 is concerned.

Only the initialization phase 2200 and the reloading phase 230 for the cell CELSR are different for the cell CEL in FIG. 4.

First of all, prior to the reloading, the cell CELSR is initialized (step 2200 FIG. 5) by writing a data item so that the node ND2, which is common to the second interconnection transistor N2 and to the output of the corresponding inverter P2, N4, is in the high state, which corresponds to the initialization of the SRAM cell with a logic data item "0" (instead of the logic data item "1" in the case of the cell in FIG. 1).

As illustrated in FIG. 5, the second control line PRL is in the low state, turning off the transistor N2. The first control line CGL changes to a read reference voltage (typically 1 volt), and the third control line RLL receives a control voltage, for example equal to 2 volts, turning on the second interconnection transistor N6.

The word line WL is held at ground.

If the elementary memory cell CELSR initially stored a "1", which is now stored in the nonvolatile cell E1, the transistor E1 is on and pulls the node ND2 to ground through the transistor N6. Furthermore, the elementary memory cell CELSR retoggles into the logic state "1".

If, on the other hand, the cell CELSR initially stored a "0", which is now contained in the nonvolatile cell E1, the latter is off and the two inverters of the elementary memory cell CELSR remain in their initialized state, and therefore the memory cell CELSR remains in the initialized logic state "0". Consequently, the data item is not inverted on reloading.

Figure 6:
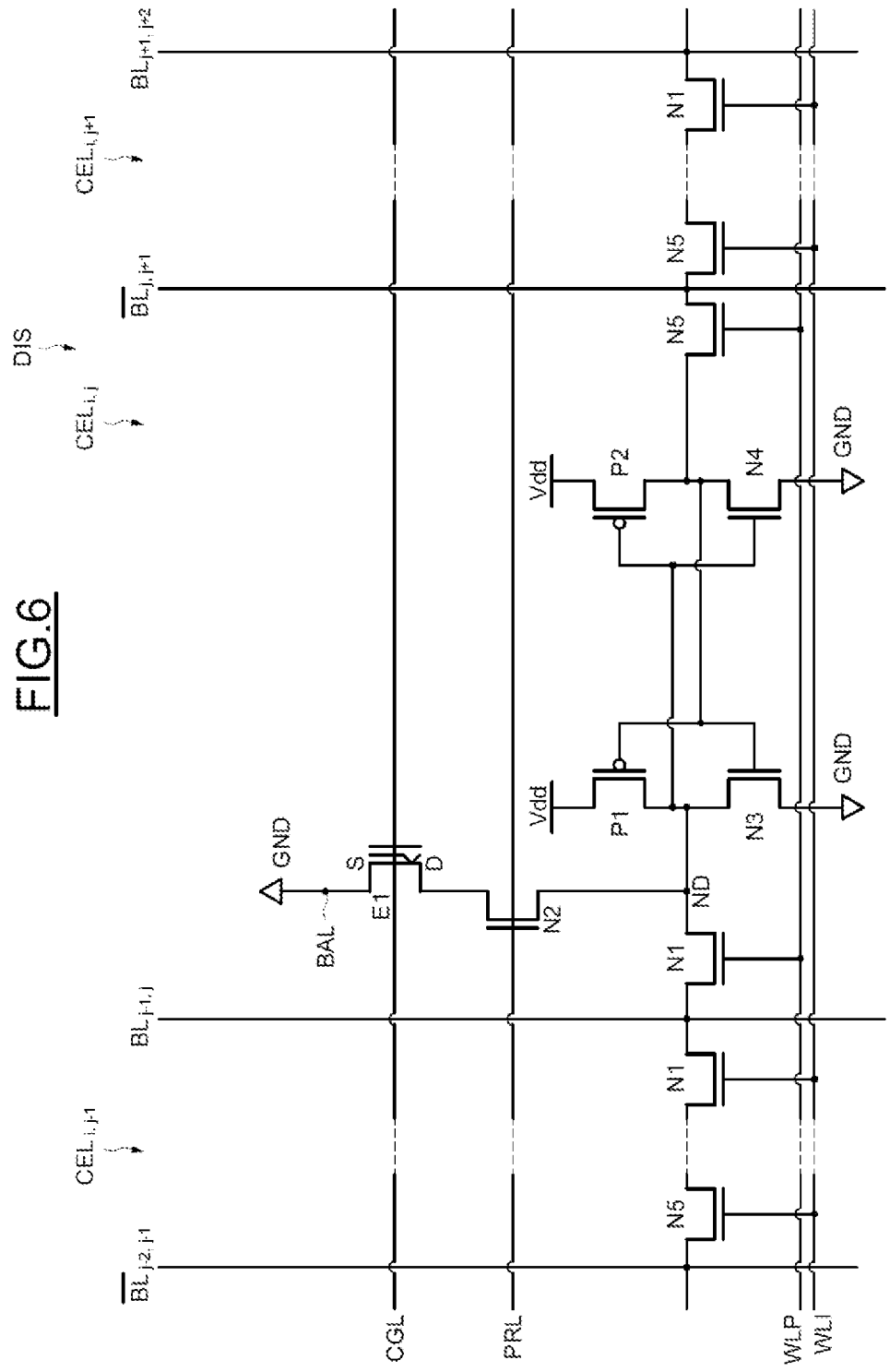

In the embodiment in FIG. 6, the memory device DIS comprises a memory map comprising several memory cells $CEL_{i,j}$ organized into rows and columns.

There is provision for bit lines that are common to the memory cells of two adjacent columns of cells.

Thus, the bit line $BL_{j-1,j}$ is common to the cells $CEL_{i,j-1}$ and $CEL_{i,j}$ belonging to the same row i and to the two adjacent columns j−1 and j. Equally, the complementary bit line $\overline{BL}_{j,j+1}$ is common to the cells $CEL_{i,j}$ and $CEL_{i,j+1}$.

There is likewise provision for two different word lines WLP and WLI associated with each row i of cells.

The two access transistors N1 and N5 of the elementary cell of SRAM type $CELSR_{i,j}$ are respectively connected to the two corresponding common bit lines $BL_{j-1,j}$ and $\overline{BL}_{j,j+1}$.

The control electrodes of the two pairs of access transistors N1, N5 of the two adjacent SRAM elementary cells $CELSR_{i,j}$ and $CELSR_{i,j+1}$ are respectively connected to two different word lines, namely alternately to the lines WLP and WLI.

Such an embodiment allows a gain in space for the placement diagram ("layout") since notably the source contact of the transistor N1 and the source contact of the transistor N5 are shared with the adjacent cell.

The cells are mirrored about X.

This embodiment requires—as indicated above—two word lines WLP, WLI to allow the bit line voltage to be directed to just one of the two adjacent cells.

This thus involves interlacing two logic word lines over a single physical row.

The sharing of the bit lines between two adjacent cells and the use of two word lines WLP and WLI applies whatever the embodiment of the memory cell CEL.

Figure 7:
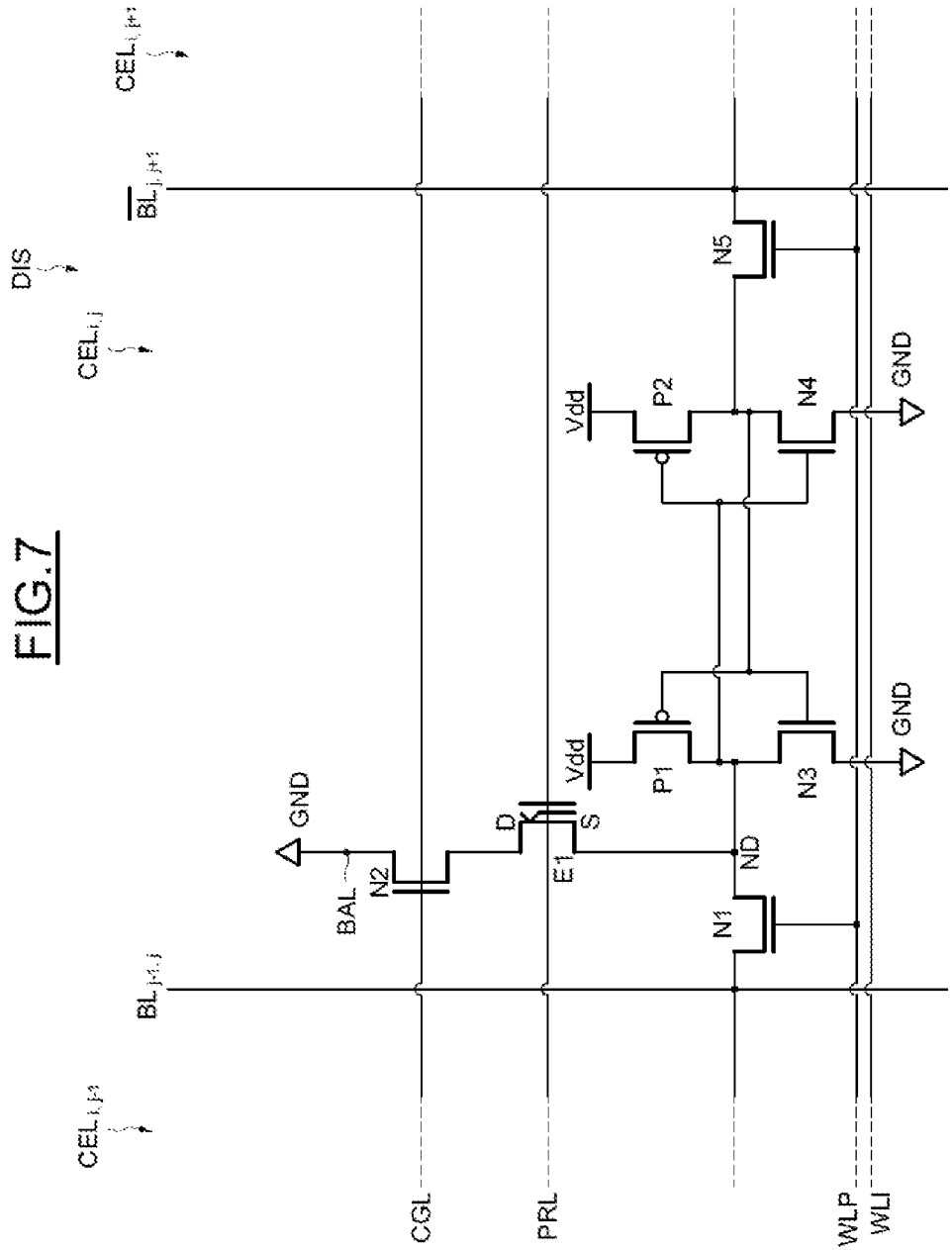
Figure 8:
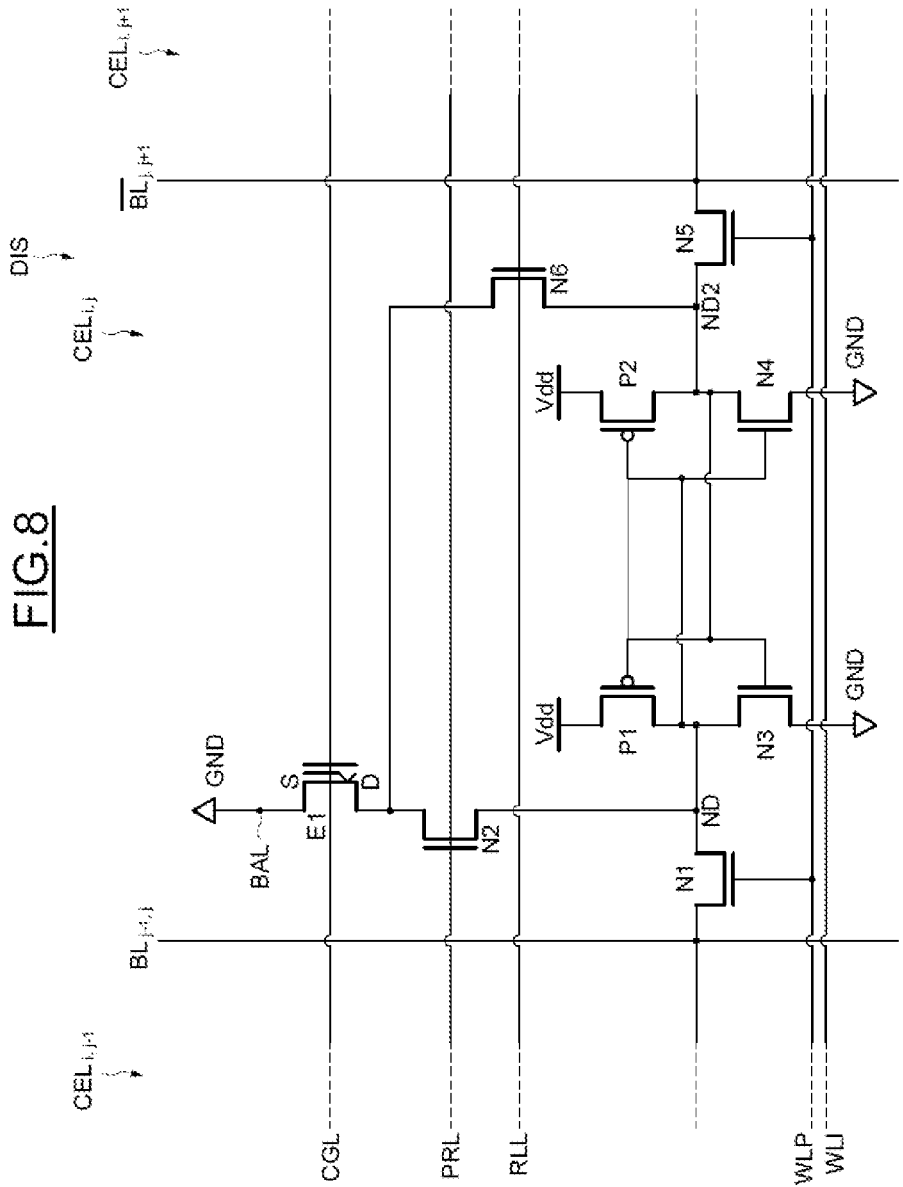

Thus, whereas in FIG. 6 the cell $CEL_{i,j}$ was compliant with the embodiment of FIG. 1, the embodiment of FIG. 7 is compliant with the embodiment of FIG. 3 and the embodiment of FIG. 8 is compliant with the embodiment of FIG. 4.

Figure 9:
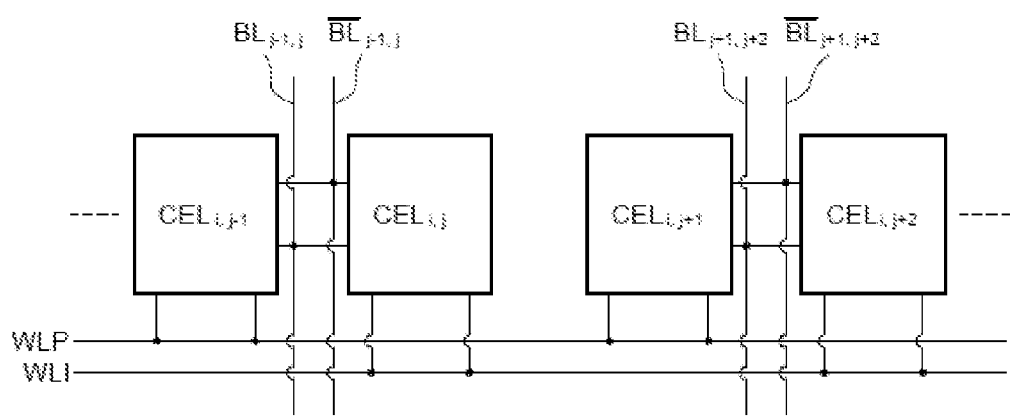

Another way of sharing the bit lines and complementary bit lines is illustrated schematically in FIG. 9.

In this figure, the cells ($CEL_{i,j-1}$, $CEL_{i,j}$; $CEL_{i,j+2}$) of two adjacent columns share both the same bit line and the same complementary bit line (the transistors N1 of these cells are connected to the same bit line and the transistors N5 are connected to the same complementary bit line). By contrast, the cells $CEL_{i,j}$, $CEL_{i,j+1}$ of two adjacent columns respectively belonging to two different pairs of adjacent columns share neither a bit line nor a complementary bit line.

Of course, there again, the control electrodes of the two pairs of access transistors N1, N5 of the two adjacent SRAM elementary cells $CELSR_{i,j}$ and $CELSR_{i,j+1}$ are respectively connected to two different word lines, namely alternately to the lines WLP and WLI.

Furthermore, in FIG. 9, each cell may be compliant with one of the embodiments illustrated in FIGS. 1, 3 and 4.

Figure 11:
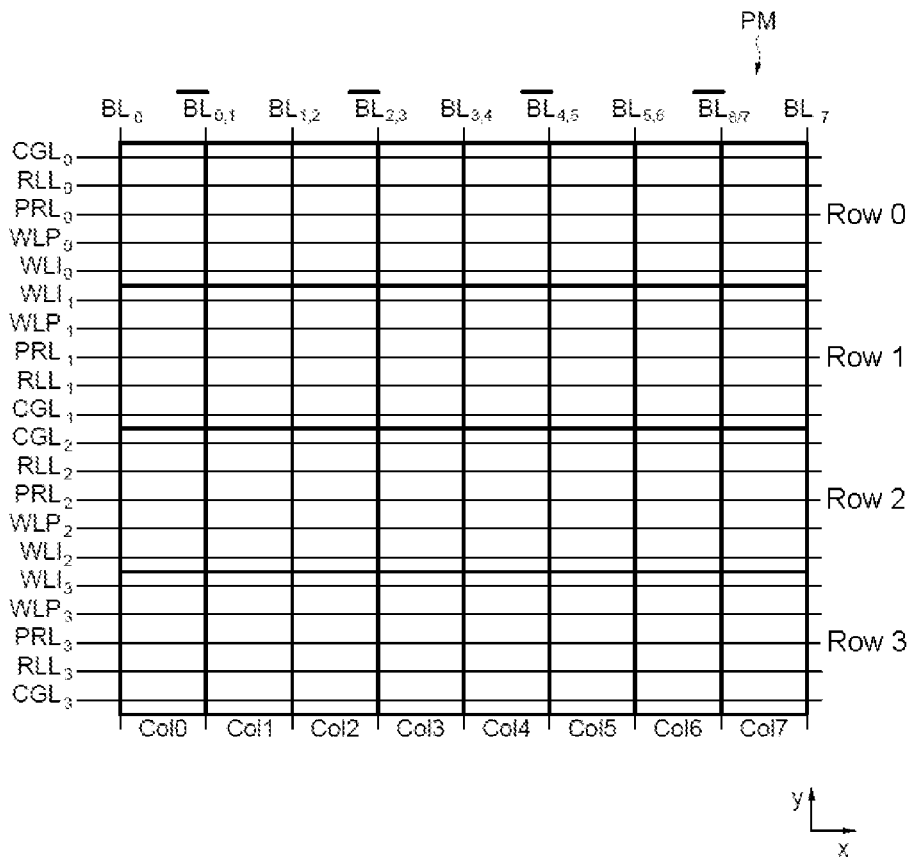

FIG. 11 illustrates an example of a memory map PM having P rows (P=4) and N columns (N=8) of cells $CEL_{i,j}$ schematically represented by a rectangle.

Figure 10:
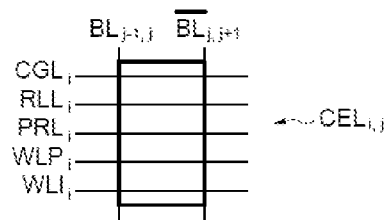

As illustrated in FIG. 10 notably, each memory cell $CEL_{i,j}$, which in this example is a cell of the cell type illustrated in FIG. 8, has metallizations (or control lines) $CGL_i$, $RLL_i$, $PRL_i$, $WLP_i$, $WLI_i$. Metallizations transporting the supply voltage Vdd and ground GND are likewise present on these cells $CEL_{i,j}$ but are not shown here in order to simplify the drawings.

Of course, if the memory cells were cells of the cell type illustrated in FIGS. 6 and 7, the metallizations $RLL_i$ would have been omitted.

It can be seen in FIG. 11 that the adjacent cells are X-mirrored and Y-mirrored. The memory map is a memory map of P times N bits (in this case 32 bits).

There are therefore N/2+1 bit lines BL and N/2 complementary bit lines $\overline{BL}$.

Equally, for P rows, there are P lines $WLP_i$ and P lines $WLI_i$.

Figure 12:
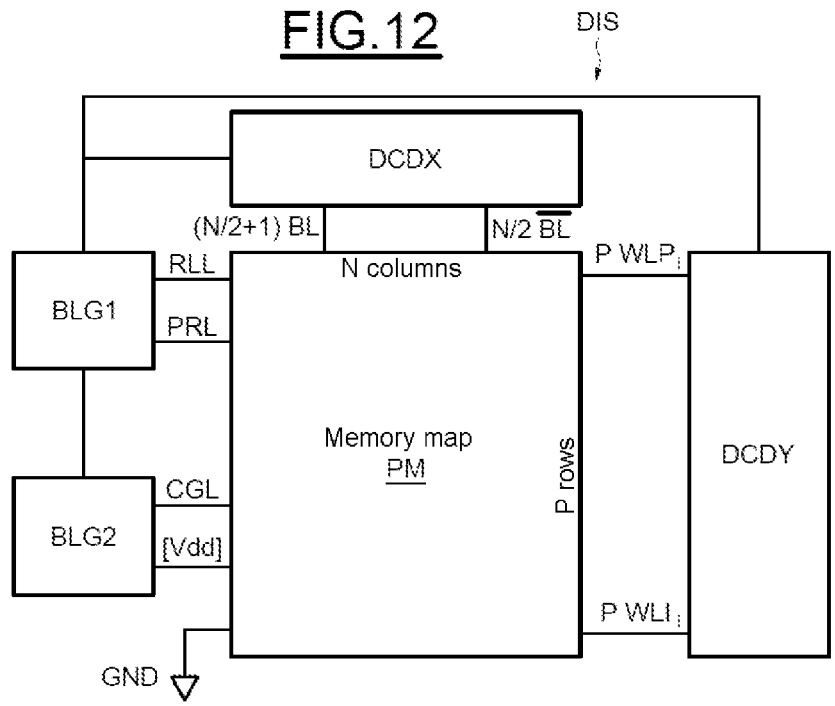

FIG. 12 provides a more precise illustration of an example of architecture of the device DIS having a memory map with N columns and P rows of memory cells, in this case of the cell type illustrated in FIG. 8. The lines $RLL_i$ are all connected together to form a single line RLL connected to a module BLG1 having a control logic unit. Equally, the lines $PRL_i$ are all connected to form a single line PRL that is likewise connected to the module BLG1. This module BLG1 may be formed by logic circuits.

Equally, the lines $CGL_i$ are all connected together to form a single line CGL connected to a second module BLG2. The metallizations Vdd are likewise connected together to form a single metallization Vdd connected to the module BLG2. Equally, all the grounded metallizations are connected together.

The module BLG2 notably has a positive/negative charge pump, a programming ramp generator, a programming sequencer, and a pump in order to generate the voltage Vdd that is necessary for the nonvolatile transfer when the overall voltage Vdd of the circuit is too low.

The P word lines $WLP_i$ and the P word lines $WLI_i$ are connected to a row decoder DCDY and the bit lines and the complementary bit lines are connected to a column decoder and to latches and read amplifiers, all these elements being globally referenced by the reference DCDX.

Figure 13:
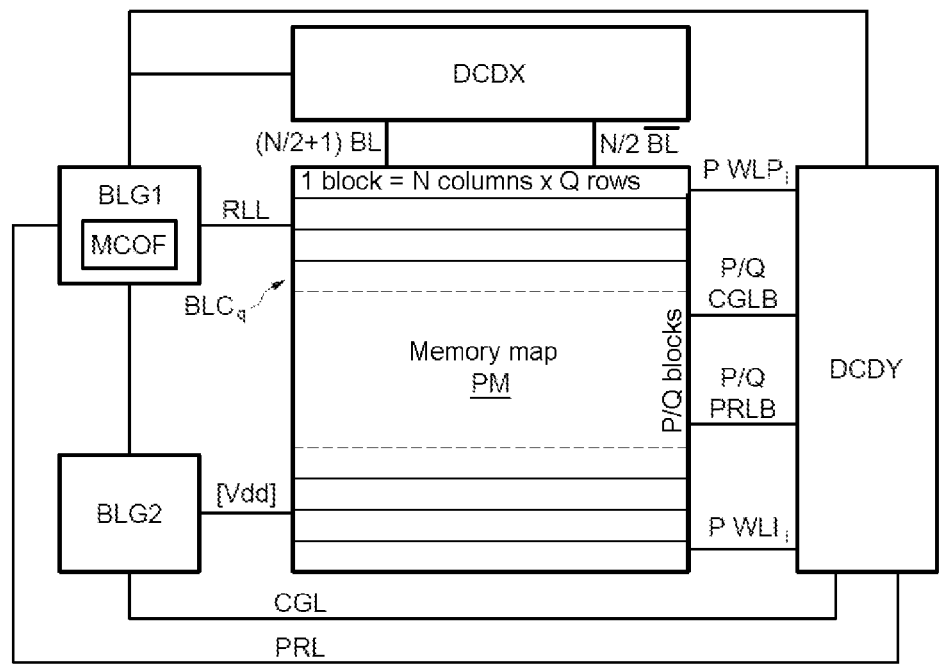

The embodiment illustrated in FIG. 13 allows the use of the device DIS either in a conventional mode of operation, for example wired, in which the nonvolatile writing (or transfer) is effected in a single pass, or in a second mode of operation, for example compatible with the use of the device DIS in a chip of contactless type, in which the nonvolatile writing is effected by block.

In practice, as illustrated in FIG. 13, a block of memory cells $BLC_q$ has several rows of memory cells in the memory map PM.

Thus, in the present case, for a memory map of N columns and P rows, a block $BLC_q$ has N×Q memory cells arranged over N columns and Q rows.

There are thus P/Q blocks. Q may be equal to 4, for example.

In relation to the embodiment in FIG. 12, each block has a first control line CGLB and a second control line PRLB. These P/Q lines CGLB and these P/Q lines PRLB are individualized from the global lines CGL and PRL after passing through the decoder DCDY.

Of course, each line CGLB is subdivided into elementary lines respectively associated with the rows of memory cells in the block. The same applies to the line PRLB.

This subdivision of the lines CGL and PRL into P/Q lines CGLB and into P/Q lines PRLB is necessary in order to allow the block nonvolatile storage function. Indeed, it is thus necessary to decode the sending of the high voltage (lines CGL) locally in the memory map. In other words, at a given instant of nonvolatile writing, some cells will receive high voltage, and others will not.

This being the case, at a given instant, all memory cells in the same block are in the same mode, namely either a read and write mode of SRAM type, or in a write mode for the nonvolatile elementary memory cells.

In order to authorize operation of the device DIS in dual operation (that is to say in a first mode of operation, for example of wired type, or in a second mode of operation, for example of contactless type), provision is made for controllable configuration means MCOF incorporated into the control block BLG1 in this case.

These configuration means MCOF have a first state in which they are capable of placing all memory cells of the memory map, that is to say all memory cells of all blocks, either in a read or write mode of SRAM type, or in a nonvolatile write mode.

In a first state of this kind, the decoder Y simultaneously decodes all lines CGLB and PRLB. The mode of operation is similar to that in FIG. 12.

The configuration means MCOF moreover have a second state, in which they are capable of selectively putting, on a block-by-block basis, all memory cells of a block either into a read or write mode of SRAM type, or into a nonvolatile write mode.

More precisely, during volatile operation of the block (SRAM), the lines CGLB and PRLB are at 0 volt, while during nonvolatile writing to the block, the line PRLB is in the high logic state (for example voltage Vdd) while the line CGLB is intended to receive the write (erase/programming) voltage.

The programming current that the charge pump needs to provide is proportional, in the first order, to the number of simultaneously programmed cells. In this case, it is thus divided by the number of blocks.

It will be noted here, by analogy with what has been described in reference to FIG. 3, that the line CGLB could be brought to Vdd/2 in volatile operation of the block (SRAM) so as to free itself from the phenomenon of parasitic programming ("disturb").

In the embodiment of FIG. 14, it is supposed that the device DIS has reception means MRCP that are configured to receive successive blocks of data. There are thus advantageously provided management means MGST, for example a state machine, which is configured to put the configuration means MCOF into their second state (step 140), then to store (step 141) a current block of data $BLD_q$ in the elementary memory cells of SRAM type of the memory cells of a block $BLC_q$ of memory cells, then to carry out a nonvolatile write cycle for the data that has thus been written to the SRAM cells to the nonvolatile elementary memory cells (step 142), and, at the same time as this nonvolatile writing, to store the next block of data $BLC_{q+1}$ in the elementary memory cells of SRAM type of memory cells of another block of memory cells, for example the next block $BLC_{q+1}$.

Thus, by way of example, if it is supposed that the blocks of data are blocks of 512 bits, the nonvolatile writing to such a block lasts approximately 4 milliseconds at the same time as the next 512 bits stored in a different block are received. Furthermore, with a speed of 106 kb/second for a radio-frequency exchange in accordance with the standard ISO/IEC 14 443B, this reception takes 4.83 milliseconds.

It can thus be stated that the nonvolatile writing to a block is faster than an SRAM data transfer to the next block. The nonvolatile writing is therefore transparent.

Thus, such an embodiment is transparent vis-à-vis the preferred wired mode of operation, and allows a reduction typically by a factor greater than 10 in nonvolatile storage consumption during radio-frequency exchanges, this nonvolatile storage being transparent during the radio-frequency exchanges.

In a general manner, for the operation of the SRAM elementary memory cell (reading or writing or reloading from the EEPROM cell), the minimum value of the supply voltage Vdd is approximately 1.2 volts.

For nonvolatile storage or transfer, the minimum value of Vdd is 2 to 3 volts in order to allow good selectivity for the erase cycle.

If the overall voltage Vdd of the circuit is 1.2 volts, the 2 to 3 volts are obtained by means of pumping during nonvolatile cycles. However, pumping of the voltage Vdd is necessary only for the block undergoing nonvolatile writing, the other blocks being able to preserve the overall lower and unpumped value Vdd.

Consequently, in order to reduce the power consumed for nonvolatile writing, it is advantageous for the pumped voltage Vdd to be applied only to the block receiving nonvolatile writing. This reduces the charge seen by the charge pump generating the voltage Vdd of 3 volts.

Figure 15:
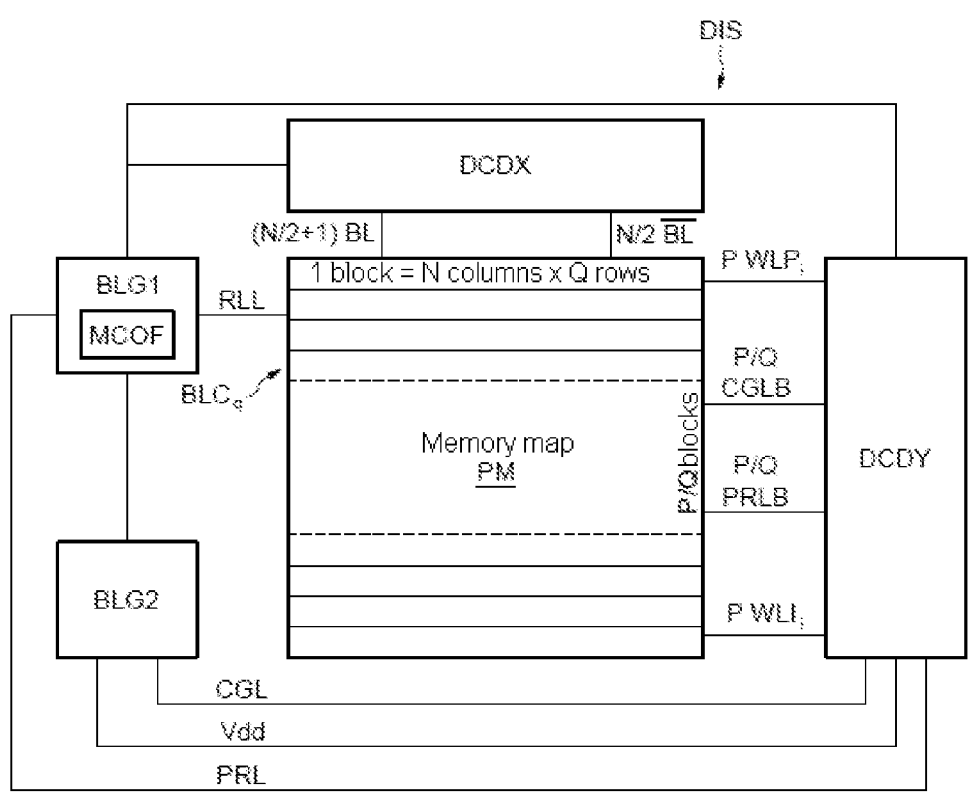

Consequently, an embodiment is provided (FIG. 15) in which, in relation to the embodiment in FIG. 13, the decoder DCDY receives the pumped voltage Vdd and directs it specifically to a block among the P/Q, this block being the one performing nonvolatile writing. The other blocks receive the unpumped overall supply voltage Vdd.

Generally, upon power-up, the whole memory map is supplied with power (in fact the whole SRAM memory map, since the nonvolatile cells are not supplied with power) so as to put all elementary memory cells of SRAM type into a known reinitialized state and to reload (at the same time or subsequently) the data contained in the nonvolatile elementary memory cells into the associated SRAM elementary memory cells.

These two steps both consume current, and therefore the consumption of the circuit risks being at a maximum upon power-up, which may be annoying when the product is a specified low-consumption product or when the memory device is inserted into a contactless chip capable of talking to a contactless reader, for example on a radio-frequency carrier.

Figure 16:
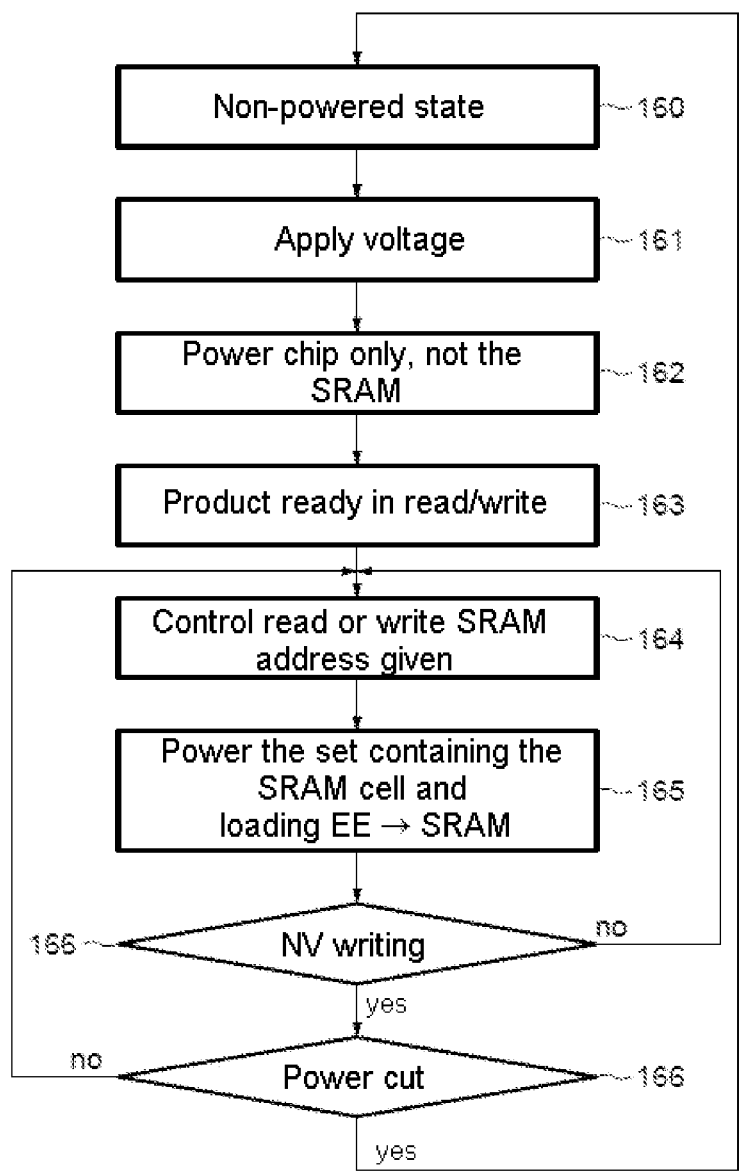
Figure 17:
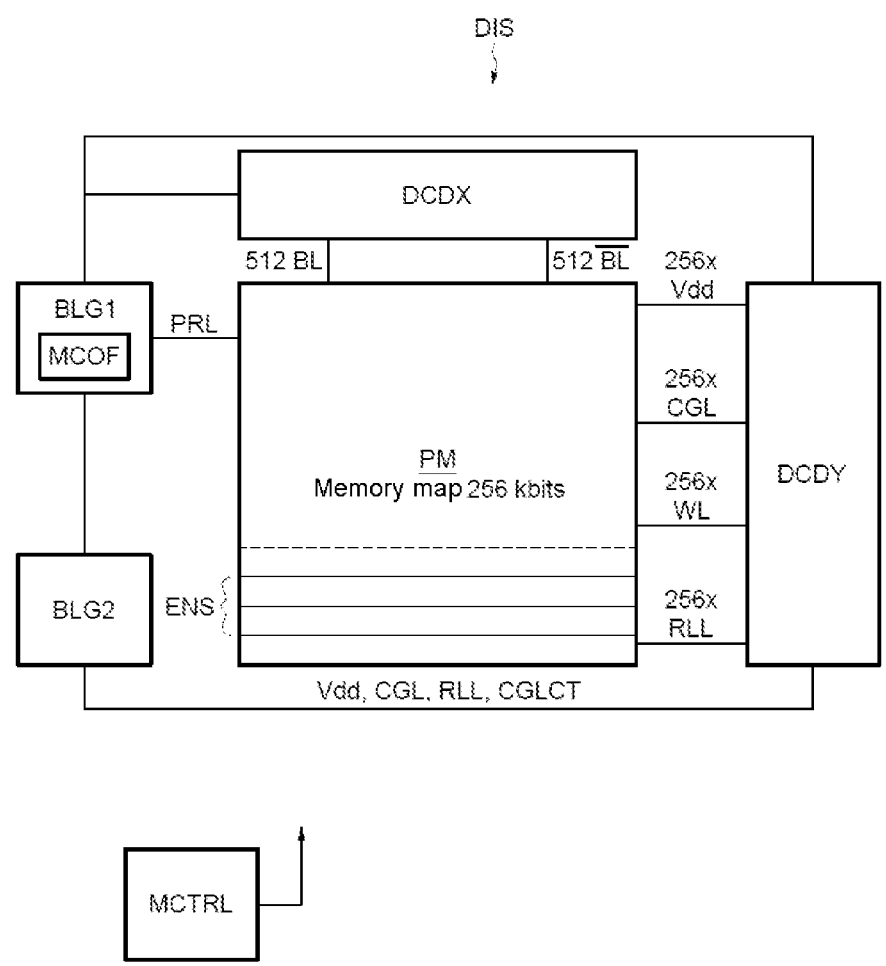
Figure 18:
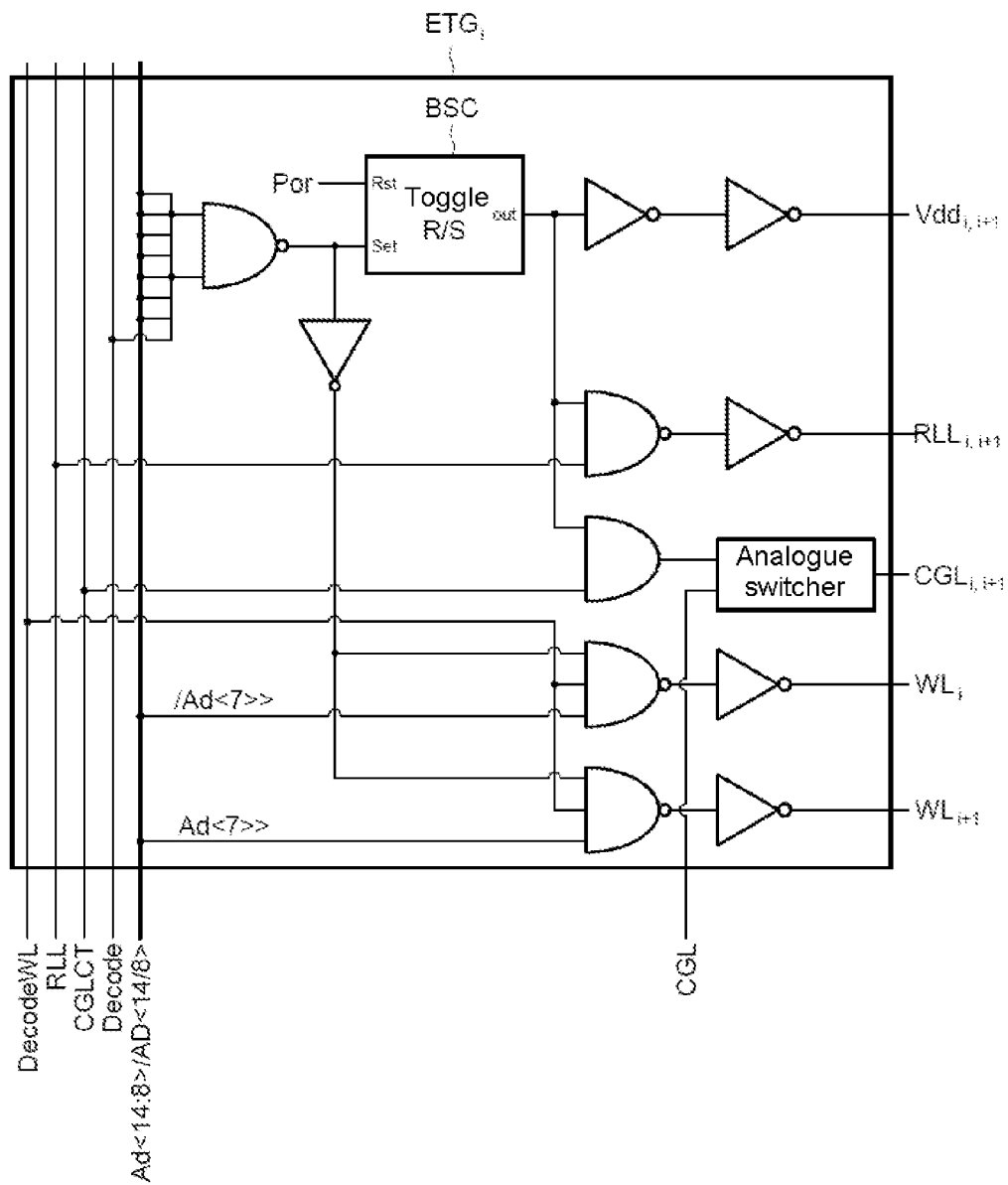

The embodiment and implementation illustrated in FIGS. 16 to 18 is particularly compatible with a low-consumption constraint.

More precisely, as illustrated in FIG. 16, when the chip incorporating the memory device is in an unpowered state (step 160), the chip alone is supplied with power (step 162), but the memory map is not supplied with power, following power-up (step 161), regardless of whether this power-up be an initial power-up or else a power-up subsequent to a power cut.

Following this supply of power (step 162), the device is ready for the reading/writing from/to the SRAM elementary memory cells (step 163).

In the presence of a read or write command for an SRAM elementary memory cell at a given address (step 164), power is then supplied (step 165) to the set of memory cells containing the SRAM cell in question, and authorization is given to reload this SRAM elementary memory cell in question with the content of the nonvolatile elementary memory cell that is associated therewith, and to reload all other SRAM elementary memory cells in the set.

As will be seen in more detail below, this set of memory cells may have two rows of memory cells, for example.

It is worth noting at this juncture that reloading of the set of SRAM memory cells (the two rows, for example) prior to writing to an SRAM memory cell is likewise advantageously effected so as to prevent the other SRAM memory cells in the pair of rows from being in a metastable state.

At the conclusion of this reloading (step 165), it is or is not possible to carry out nonvolatile writing (step 166) to the nonvolatile elementary memory cells, and, in the case of a new power cut (step 167), there is a return to the unpowered state (step 160), whereas there is a return to state 163 in the absence of a power cut (step 67).

As illustrated in FIG. 17, the device DIS according to this embodiment has control means MCTRL configured to carry out notably steps 162 and 165.

In the example illustrated, the memory map PM is a memory map of 256 kbits having 512 rows of memory cells and 512 columns of memory cells of the cell type illustrated in FIG. 4.

In this example, the bit lines BL and the complementary bit lines $\overline{BL}$ are not shared between adjacent cells. There are therefore 512 bit lines $\overline{BL}$ and 512 bit lines $\overline{BL}$.

On the other hand, in this example, the control lines CGL and the power supply lines Vdd are shared between two adjacent rows of cells, in the same way as the control lines RLL. Two adjacent rows form the set ENS of memory cells.

Following passage through the decoder DCDY, the lines Vdd, CGL and RLL are thus subdivided into 256 corresponding lines.

After decoding DCDY, there are likewise 512 word lines WLi.

On the other hand, since the nonvolatile elementary cells are programmed from the SRAM memory cells in a single pass, there still remains a single control line PRL.

Thus, as explained above, any access to an address brings about prior power-up of the supply line Vdd assigned to this address and parallel reloading of the data contained in the nonvolatile memories into the associated SRAM memories of all cells connected to this supply line. This may thus be transparent in a serial access protocol.

There is thus selective and progressive reloading of the SRAM memory map as a function of the accessed data.

The row decoder DCDY in this case has 256 stages ETGi such as the one illustrated schematically by way of nonlimiting example in FIG. 18.

More precisely, each stage receives the signal RLL, a logic signal CGLCT for controlling the first control lines CGL, the voltage CGL in the strict sense, a logic signal DecodeWL for decoding the word lines, an activation signal Decode and the address bytes. The stage ETGi notably has an RIS flipflop referenced BSC, the Set input of which receives the address bytes via a logic gate.

The signal POR (Power On Reset) received at the Rst input of the flipflop is an internally generated reinitialization signal that reinitializes all registers and various memory storage systems. It is conventionally generated when the supply voltage rises.

Other logic gates and inverters allow delivery of the signals $Vdd_{i,i+1}$, $RLL_{i,i+1}$, $CGL_{i,i+1}$ for the lines i and i+1, in the same way as the signals $WL_i$ and $WL_{i+1}$ for the corresponding word lines.

The control voltage CGL is delivered directly to the analogue switch connected downstream of its control logic gate ET receiving the logic signal CGLCT at one of its inputs.

The chronology is as follows.

Upon power-up, no power is supplied to the SRAM memory map. All output signals from the stages $ETG_i$ are at zero.

A read command is translated into series by a specific code (opcode) and then in this case by two address bytes.

Upon reception of an address, the signal Decode and a pulse at the "set" input of the flipflop BSC are activated.

The result of this is a definitive rise in the signal Vdd from two physical rows, in the same way as the rise in the signals RLL and CGL from these two physical rows.

Next, the data contained in the nonvolatile elementary memory cells are reloaded into the SRAM elementary cells of the two rows.

At the end of the reloading, the lines CGL and RLL return to "0".

Such an embodiment allows overconsumption to be distributed over time, instead of having a consumption peak for the total reloading of the SRAM memory map with the content of the nonvolatile elementary memories.

Of course, what has just been described in reference to FIGS. 16 to 18 also applies to memory cells of the cell type illustrated in FIG. 1 or 3.

In this case, the metallizations RLL are omitted and it is the metallization PRL that is subdivided into 256 metallizations PRL after passing through the decoder DCDY. This being the case, in order to carry out programming of the nonvolatile elementary memory cells in a single pass, all 256 lines PRL are activated simultaneously during the programming.

Moreover, it is quite possible to combine the embodiments of FIGS. 13 and 17, that is to say to have a memory device in which the elementary memory cells CELSR can be transferred to the nonvolatile elementary memory cells in blocks while the elementary memory cells CELSR can be reloaded on a row-by-row basis, for example.

The memory device that has just been described may, in all of its variant embodiments, be part of an integrated circuit, for example, but not restrictively incorporated within a chip of a contactless product, for example a contactless chip card.

What is claimed is:

1. A memory device comprising a memory cell, the memory cell comprising:
   an elementary SRAM-type cell; and
   an elementary module coupled between a supply terminal and the elementary SRAM-type cell, the elementary module having a single nonvolatile EEPROM elementary memory cell that includes a floating gate transistor, the elementary module also having a interconnection stage that is configured to be controlled by a control signal external to the memory cell, the single nonvolatile EEPROM elementary memory cell and the interconnection stage being connected to one another, the floating gate transistor of the single nonvolatile EEPROM elementary memory cell being controllable to be turned off when a data item stored in the elementary SRAM-type cell is programmed into the single nonvolatile EEPROM elementary memory cell.

2. The device according to claim 1, wherein the interconnection stage is connected between the single nonvolatile EEPROM elementary memory cell and the elementary SRAM-type cell.

3. The device according to claim 2, wherein the elementary SRAM-type cell has first and second inverters connected to one another crosswise and the single nonvolatile EEPROM elementary memory cell comprises a floating-gate transistor having a first conduction electrode connected to the supply terminal, a control electrode connected to a first control line, and a second conduction electrode connected to an output of the first inverter; and
   wherein the interconnection stage comprises a first interconnection transistor connected in series with the floating-gate transistor and having a control electrode connected to a second control line, the interconnection stage comprising the first interconnection transistor and the floating-gate transistor being connected between the supply terminal and the output of the first inverter.

4. A method of writing a data item stored in the elementary SRAM-type cell to the single nonvolatile EEPROM elementary memory cell of the memory cell of the memory device according to claim 3, the method comprising:
   performing an erase cycle for the single nonvolatile EEPROM elementary memory cell; and
   performing a programming cycle for the single nonvolatile EEPROM elementary memory cell following the erase cycle, the programming cycle involving putting the first interconnection transistor into an on state and applying a negative programming voltage to the control electrode of the floating-gate transistor so as to turn off the floating-gate transistor.

5. The device according to claim 1, wherein the interconnection stage is connected between the single nonvolatile EEPROM elementary memory cell and the supply terminal.

6. The device according to claim 5, wherein the elementary SRAM-type cell has two inverters connected to one another crosswise and the single nonvolatile EEPROM elementary memory cell comprises a floating-gate transistor having a first conduction electrode connected to the supply terminal, a control electrode connected to a first control line, and a second conduction electrode connected to an output of a first inverter; and
   wherein the interconnection stage comprises a first interconnection transistor connected in series with the floating-gate transistor and having a control electrode connected to a second control line, the interconnection stage comprising the first interconnection transistor and the floating-gate transistor being connected between the supply terminal and the output of the first inverter.

7. The device according to claim 1, wherein the elementary SRAM-type cell has a first inverter and a second inverter connected to one another crosswise and the single nonvolatile EEPROM elementary memory cell comprises a floating-gate transistor having a first conduction electrode connected to the supply terminal, a control electrode connected to a first control line, and a second conduction electrode connected to an output of the first inverter.

8. The device according to claim 7, wherein the interconnection stage comprises a first interconnection transistor connected in series with the floating-gate transistor and having a control electrode connected to a second control line, the interconnection stage comprising the first interconnection transistor and the floating-gate transistor being connected between the supply terminal and the output of the first inverter.

9. The device according to claim 8, wherein the interconnection stage is connected between the single nonvolatile EEPROM elementary memory cell and the elementary SRAM-type cell and wherein the interconnection stage further comprises a second interconnection transistor having a control electrode connected to a third control line, connected between the floating-gate transistor and an output of the second inverter.

10. The device according to claim 1, wherein the supply terminal comprises a ground terminal.

11. The device according to claim 10, wherein the elementary SRAM-type cell has a first inverter and a second inverter connected to one another crosswise and the single nonvolatile EEPROM elementary memory cell comprises a floating-gate transistor having a first conduction electrode connected to the supply terminal, a control electrode connected to a first control line, and a second conduction electrode connected to an output of the first inverter; and
wherein the interconnection stage comprises a first interconnection transistor connected in series with the floating-gate transistor and having a control electrode connected to a second control line, the interconnection stage comprising the first interconnection transistor and the floating-gate transistor being connected between the supply terminal and the output of the first inverter.

12. A method of reloading a data item programmed in the single nonvolatile EEPROM elementary memory cell into the elementary SRAM-type cell of the memory cell of the device according to claim 11, the method comprising initializing the elementary SRAM-type cell by writing a data item to the elementary SRAM-type cell in a manner such that a node that is common to the first interconnection transistor and to the output of the first inverter of the elementary SRAM-type cell is in a high state, putting the first interconnection transistor into an on state, and applying a read voltage to the control electrode of the floating-gate transistor.

13. The device according to claim 11, wherein the interconnection stage is connected between the single nonvolatile EEPROM elementary memory cell and the elementary SRAM-type cell and wherein the interconnection stage further comprises a second interconnection transistor having a control electrode connected to a third control line, connected between the floating-gate transistor and an output of the second inverter.

14. A method of reloading a data item programmed in the single nonvolatile EEPROM elementary memory cell into the elementary SRAM-type cell of the memory cell of the device according to claim 13, the method comprising initializing the elementary SRAM-type cell by writing a data item to the elementary SRAM-type cell in a manner such that a node that is common to the second interconnection transistor and to the output of the second inverter of the elementary SRAM-type cell is in a high state, putting the first interconnection transistor into an off state, putting the second interconnection transistor into an on state and applying a read voltage to the control electrode of the floating-gate transistor.

15. The device according to claim 1, wherein the memory device comprises a memory map containing a plurality of memory cells organized into rows and columns, bit lines and complementary bit lines common to memory cells of at least some pairs of adjacent columns of cells, two different word lines associated with each row of cells, two access transistors of the elementary SRAM-type cell of a memory cell being respectively connected to corresponding common bit lines and complementary bit lines, and control electrodes of two pairs of access transistors of two adjacent cells of the elementary SRAM-type cell are respectively connected to the two different word lines.

16. The device according to claim 1, wherein the memory device comprises a memory map containing a plurality of memory cells organized into blocks of cells, the memory device further comprising controllable configuration circuitry operable in
a first state in which the configuration circuitry is capable of putting all memory cells of the memory map either into a read or write mode of SRAM type or into a write mode for nonvolatile EEPROM elementary memory cells, and
a second state in which the configuration circuitry is capable of selectively putting, block by block, all memory cells of a block either into a read or write mode of SRAM type or into a write mode for the nonvolatile EEPROM elementary memory cells.

17. The device according to claim 16, further comprising:
a receiver configured to receive successive blocks of data; and
management circuitry configured to
put the configuration circuitry into the second state,
store a current block of data in elementary SRAM-type cells of memory cells of a block of memory cells,
then carry out a nonvolatile write cycle for the current block of data thus written to the elementary SRAM-type cells, in the nonvolatile EEPROM elementary memory cells of the memory cells of the block of memory cells, and,
at a same time as carrying out the nonvolatile write cycle, store the next block of data in elementary SRAM-type cells of memory cells of another block of memory cells.

18. The device according to claim 16, wherein the plurality of memory cells of the memory map is organized into rows and columns, and each block of memory cells has a plurality of rows of memory cells.

19. The device according to claim 1, wherein the memory device comprises a memory map containing a plurality of memory cells, the memory device further comprising a controller configured to cause the memory device to operate so, when the memory device is supplied with power, no power is supplied to the memory map and power is supplied to a set of one or more memory cells, the elementary SRAM-type cell of the set of one or more memory cells being reloaded with contents of the single nonvolatile EEPROM elementary memory cell of the set of one or more memory cells, only when the elementary SRAM-type cell is addressed.

20. The device according to claim 19, wherein the set of one or more memory cells is a set of memory cells including a plurality of memory cells and the controller is configured to cause the memory device to operate so, during a supply of power to the memory device, no power is supplied to the memory map and power is supplied to the set of memory cells, all elementary SRAM-type cells of the set of memory cells being reloaded with contents of corresponding nonvolatile elementary memory cells, only when at least one elementary SRAM-type cell of the set of memory cells is addressed.

21. The device according to claim 20, wherein the memory map contains a plurality of memory cells organized into rows and columns and wherein the set of memory cells has at least one row of memory cells.

22. A memory device comprising a memory cell, the memory cell comprising:
- an elementary SRAM-type cell; and
- an elementary module coupled between a supply terminal and the elementary SRAM-type cell, the elementary module having a single nonvolatile EEPROM elementary memory cell that includes a floating gate transistor, the elementary module also having an interconnection stage connected between the single nonvolatile EEPROM elementary memory cell and the supply terminal, the interconnection stage controllable by a control signal external to the memory cell, the single nonvolatile EEPROM elementary memory cell and the interconnection stage being connected to one another, the floating gate transistor of the single nonvolatile EEPROM elementary memory cell being controllable to be turned off when a data item stored in the elementary SRAM-type cell is programmed into the single nonvolatile EEPROM elementary memory cell.

23. The device according to claim 22, wherein the elementary SRAM-type cell has first and second inverters connected to one another crosswise and the single nonvolatile EEPROM elementary memory cell comprises a floating-gate transistor having a first conduction electrode connected to the supply terminal, a control electrode connected to a first control line, and a second conduction electrode connected to an output of the first inverter; and
- wherein the interconnection stage comprises a first interconnection transistor connected in series with the floating-gate transistor and having a control electrode connected to a second control line, the interconnection stage comprising the first interconnection transistor and the floating-gate transistor being connected between the supply terminal and the output of the first inverter.

24. A method of writing a data item stored in the elementary SRAM-type cell to the single nonvolatile EEPROM elementary memory cell of the memory cell of the device according to claim 23, the method comprising:
- performing an erase cycle for the single nonvolatile EEPROM elementary memory cell; and
- performing a programming cycle involving putting the first interconnection transistor into an off state and applying a negative programming voltage to the control electrode of the floating-gate transistor.

25. The method according to claim 24, wherein the erase cycle comprises putting the first interconnection transistor into an off state and applying to the control electrode of the floating-gate transistor an erase voltage turning off the floating-gate transistor or leaving it in the state preceding an erasure at a conclusion of the erasure, as a function of a binary value of the data item.

26. A memory device comprising a memory cell, the memory cell comprising:
- an elementary SRAM-type cell comprising first and second inverters connected to one another crosswise; and
- an elementary module coupled between a supply terminal and the elementary SRAM-type cell;
- wherein the elementary module comprises a single nonvolatile EEPROM elementary memory cell that includes a floating gate transistor, the elementary module also comprising an interconnection stage that is configured to be controlled by a control signal external to the memory cell;
- wherein the single nonvolatile EEPROM elementary memory cell and the interconnection stage are connected to one another;
- wherein the floating gate transistor has a first conduction electrode connected to the supply terminal, a control electrode connected to a first control line, and a second conduction electrode connected to an output of the first inverter; and
- wherein the floating gate transistor is controllable to be turned off when a data item stored in the elementary SRAM-type cell is programmed into the single nonvolatile EEPROM elementary memory cell.

27. The device according to claim 26, wherein the interconnection stage comprises a first interconnection transistor connected in series with the floating gate transistor and having a control electrode connected to a second control line, the interconnection stage comprising the first interconnection transistor and the floating gate transistor being connected between the supply terminal and the output of the first inverter.

28. The device according to claim 27, wherein the interconnection stage is connected between the single nonvolatile EEPROM elementary memory cell and the elementary SRAM-type cell and wherein the interconnection stage further comprises a second interconnection transistor having a control electrode connected to a third control line, connected between the floating gate transistor and an output of the second inverter.

29. A method of writing a data item stored in the elementary SRAM-type cell to the single nonvolatile EEPROM elementary memory cell of the memory cell of the device according to claim 28, wherein method comprises:
- performing an erase cycle for the single nonvolatile EEPROM elementary memory cell; and
- performing a programming cycle for the single nonvolatile EEPROM elementary memory cell following the erase cycle, the programming cycle involving putting the first interconnection transistor into an on state, putting the second interconnection transistor into an off state and applying a negative programming voltage to the control electrode of the floating gate transistor so as to turn off the floating gate transistor.

30. The method according to claim 29, wherein the erase cycle comprises putting the first interconnection transistor into an off state and applying to the control electrode of the floating gate transistor an erase voltage turning off the floating gate transistor or leaving it in the state preceding an erasure at a conclusion of the erasure, as a function of a binary value of the data item.

* * * * *